(12) United States Patent
Aekins et al.

(10) Patent No.: US 7,280,032 B2
(45) Date of Patent: Oct. 9, 2007

(54) APPARATUS AND METHOD FOR COMMUNICATION SYSTEM

(75) Inventors: Robert A. Aekins, Quaker Hill, CT (US); Joseph E. Dupuis, Ledyard, CT (US)

(73) Assignee: Ortronics, Inc., New London, CT (US)

( * ) Notice: Subject to any disclaimer, the term of this patent is extended or adjusted under 35 U.S.C. 154(b) by 65 days.

(21) Appl. No.: 11/056,729

(22) Filed: Feb. 11, 2005

(65) Prior Publication Data
US 2006/0181459 A1    Aug. 17, 2006

(51) Int. Cl.
G05B 11/01    (2006.01)
(52) U.S. Cl. .............................. 340/310.11; 340/310.17
(58) Field of Classification Search .................... None
See application file for complete search history.

(56) References Cited

U.S. PATENT DOCUMENTS

| | | | |
|---|---|---|---|
| 4,272,758 A | 6/1981 | Giraud | |
| 5,148,144 A | 9/1992 | Sutterlin et al. | |
| 5,257,006 A * | 10/1993 | Graham et al. | 307/11 |
| 5,652,893 A | 7/1997 | Ben-Meir et al. | |
| 5,994,998 A | 11/1999 | Fisher et al. | |
| 6,115,468 A | 9/2000 | De Nicolo | |
| 6,140,911 A | 10/2000 | Fisher et al. | |
| 6,218,930 B1 | 4/2001 | Katzenberg et al. | |
| 6,295,356 B1 | 9/2001 | De Nicolo | |
| 6,308,240 B1 | 10/2001 | De Nicolo | |
| 6,329,906 B1 | 12/2001 | Fisher et al. | |
| 6,348,874 B1 | 2/2002 | Cole et al. | |
| 6,373,377 B1 | 4/2002 | Sacca et al. | |
| 6,473,608 B1 | 10/2002 | Lehr et al. | |
| 6,496,105 B2 | 12/2002 | Fisher et al. | |
| 6,535,983 B1 | 3/2003 | McCormack et al. | |
| 6,546,494 B1 | 4/2003 | Jackson et al. | |
| 6,640,308 B1 | 10/2003 | Keyghobad et al. | |
| 6,643,566 B1 | 11/2003 | Lehr et al. | |
| 6,650,554 B2 | 11/2003 | Darshan | |
| 6,658,108 B1 | 12/2003 | Bissell et al. | |
| 6,665,404 B2 | 12/2003 | Cohen | |
| 6,710,704 B2 | 3/2004 | Fisher et al. | |
| 2002/0190696 A1 | 12/2002 | Darshan | |
| 2002/0191553 A1 | 12/2002 | Lehr et al. | |
| 2002/0196004 A1 | 12/2002 | Berson et al. | |
| 2003/0099076 A1 | 5/2003 | Elkayam et al. | |

(Continued)

*Primary Examiner*—Julie Bichngoc Lieu
(74) *Attorney, Agent, or Firm*—McCarter & English, LLP

(57) ABSTRACT

An apparatus/system for use in coupling power from a power supply to a device over a network transmission medium is provided. The coupling apparatus/system generally includes one or more common mode chokes that feature a first winding and a second winding, the first winding being electrically connected between the first terminal of the power supply and the first electrical conductor of the network transmission medium, and the second winding being coupled between the first terminal of the power supply and the first electrical conductor of the network transmission medium. The common mode choke generally includes at least one core for coupling the first and second windings of the one or more common mode chokes. An RJ45 to 110 IDC modular connector may be connected to a printed circuit board used to transfer high speed signals for telecommunication interface media connections. The printed circuit board is configured to help reduce near-end crosstalk (NEXT) without compromising impedance. DC power is coupled upon the signal line by utilizing a wideband high impedance common mode choke design.

24 Claims, 24 Drawing Sheets

U.S. PATENT DOCUMENTS

| | | |
|---|---|---|
| 2003/0107269 A1 | 6/2003 | Jetzt |
| 2003/0202655 A1 | 10/2003 | Nattkemper et al. |
| 2004/0024933 A1 | 2/2004 | Billington et al. |
| 2004/0025066 A1 | 2/2004 | Jackson et al. |
| 2004/0037300 A1 | 2/2004 | Lehr et al. |
| 2004/0049321 A1 | 3/2004 | Lehr et al. |
| 2005/0285693 A1* | 12/2005 | Wasaki et al. ............ 333/12 |
| 2006/0158814 A1* | 7/2006 | Wasaki et al. ........... 361/118 |

* cited by examiner

APPARATUS AND METHOD FOR COMMUNICATION SYSTEM

BACKGROUND

1. Technical Field

The present disclosure relates to communication systems and methods and to advantageous devices, systems and/or components for use in association therewith.

2. Background Information

A network, e.g., a local area network (LAN), typically includes a plurality of personal computers and/or other devices (e.g., processors, servers, IP telephones, cameras, and the like) that are interconnected via network transmission media (e.g., wires and/or cables) and/or other network devices (e.g., hubs, switches, patch panels and the like). Personal computers and other network devices have traditionally received power from wall mounted outlets that supply 120 VAC (voltage alternating current). However, it has been determined that the need to receive power from wall mounted outlets can be eliminated, or at least reduced, in certain instances. One such circumstance involves devices that are connected to networks.

More particularly, devices that are connected to network transmission media (e.g., Ethernet transmission media) may be capable of receiving sufficient power over the network such that the device may be powered without causing intolerable effects to data transmitted via the transmission media. For example, U.S. Pat. No. 6,218,930 issued to Katzenberg et al. discloses an apparatus and method for use in supplying power via a network transmission medium.

Consequently, systems are now being developed for providing power over a network transmission medium, e.g., an Ethernet transmission medium. One such type of system is the "Power Over Ethernet 6000 Midspan Series" (referred to hereafter as the "Midspan Series"), manufactured by PowerDsine (Hod Hasharon, Israel). The "Midspan Series" is adapted to be installed between a power source and a patch panel. As is known in the art, a patch panel is a type of midspan device that is often used in making connections between transmission media, devices and/or combinations thereof. For example, a patch panel may be used to connect network computers to each other and/or to other network device(s) that connect to a wide area network, e.g., the Internet. Some patch panels are similar to static switchboards and include a plurality of sockets or ports that are adapted to receive plugs disposed at ends of short cables of network transmission media (sometimes referred to as patch cables or patch cords). Such patch panels enable devices to be connected to one another by virtue of plugging the plug ends of patch cords into appropriate port(s) of the patch panel. Devices may be disconnected from one another by unplugging such patch cords from the patch panel. Some other types of patch panels (sometimes referred to as wireless patch panels) allow connections to be made and broken in response to operator-controlled switches or another type of operator-controlled input device (and/or in response to another type of device capable of providing input commands to control the wireless patch panel).

Patch panels are often mounted in rack systems, sometimes referred to as "computer racks" or simply "racks," to facilitate organization and management of the patch panels and/or the network transmission media (e.g., unshielded twisted pair (UTP) cables) which are routed to the ports of the patch panel (commonly located at the front and rear of the patch panel). For cable management purposes, the patch cords are often drawn toward one or the other side of the patch panel at the front of the rack system and, from there, routed to the desired network device and/or network communication location.

In addition, as is known in the art, many local area networks use unshielded twisted pair (UTP) cables and UTP-based systems as network transmission media. This is due in part to the large installed base of UTP cables/systems, the cost parameters associated with such cables/systems, and the ease and experience associated with installation of such systems. The demands on networks using UTP systems have increased (e.g., 100 Mbit/s and 1000 Mbit/s transmission rates) over recent years. This evolution in the marketplace has led to a desire for UTP systems that provide higher system bandwidth with lower noise. As is known in the art, a received signal generally consists of a transmission signal that is modified by various distortions. The distortions and additional unwanted signals are typically inserted by the transmission system somewhere between transmission and reception. The unwanted signals are referred to as noise, which can be a major limiting factor in the performance of a communication system, e.g., due to data errors, system malfunctions and/or loss of desired signal(s).

One category of noise is referred to as crosstalk noise. Generally speaking, crosstalk noise occurs when a signal from one source is coupled to another line. Crosstalk noise is thus a type of electromagnetic interference (EMI) which occurs through the radiation of electromagnetic energy, as described by Maxwell's wave equations (in unbounded free space a sinusoidal disturbance propagates as a transverse electromagnetic wave). One type of crosstalk noise is referred to as near end cross talk (NEXT) noise. NEXT noise is the effect of near-field capacitive (electrostatic) and inductive (magnetic) coupling between source and victim electrical transmissions. NEXT increases the additive noise at the receiver and therefore degrades the signal-to-noise ratio (SNR).

There are known methods for coupling DC power upon a four pair UTP cabling system. One method is to couple DC power on lines that do not transmit data signals. For example, 10BASE-T and 100BASE-T systems transmit on only two pairs of wires. This method does not involve utilizing low noise circuitry concepts of noise balance because the data signals are not negatively effected by the DC power coupling. Another method is to couple DC power on lines that do transmit data signals. For example, 1000BASE-T utilizes all four wire pairs for data transmission. For systems that couple power onto data transmission lines, it is advantageous to minimize the potential negative effect to the data signals. For example, coupling of DC power onto a high speed data line that is intended to perform at or above minimum category 5e performance levels will require a coupling approach that introduces minimal noise to the circuitry. If the design introduces too much noise, substantial data loss can occur.

The desire for higher system bandwidth and lower noise has led to the development of industry standards that require higher system bandwidth and lower noise connecting hardware. For example, the ANSI/TIA/EIA 568B.2 and ANSI/TIA/EIA 568B.2-1 standards define electrical performance requirements for category 5e and category 6 systems, respectively. Category 5e systems utilize the 1–100 MHz frequency bandwidth range. Category 6 systems utilize the 1–250 MHz frequency bandwidth range. Exemplary data systems that utilize the 1–250 MHz frequency bandwidth range are IEEE Token Ring, Ethernet 100Base-T and 1000Base-T. Further specifications have been developed to define electrical requirements for systems that provide power over high speed and low noise UTP cabling. For example, IEEE 802.3an defines electrical requirements for devices that deliver power over Ethernet and devices that receive power delivered thereby. TIA 568B.2-6 (draft) defines electrical and structured cabling requirements for delivering power on unshielded twisted pair (UTP) cable having four wire pairs.

FIG. 1A is a representation of a UTP cable connected to a RJ45 telecommunication plug. The UTP cable has four wire pairs, designated 1–4. The plug has eight contacts, designated 1–8, as required for a FCC part 68 RJ45 telecommunication plug. The four wire pairs are connected to the eight contacts in accordance with the requirements of T568B. More particularly, the wires of wire pair 1 are connected to contact positions 4 and 5, respectively. The wires of wire pair 2 are connected to contact positions 1 and 2, respectively. The wires of wire pair 3 are connected to contact positions 3 and 6, respectively. The wires of wire pair 4 are connected to contact positions 7 and 8, respectively. The contacts may be used, for example, for tip (positive voltage) and ring (negative voltage) signal transmissions.

Transposition or twisting of a transmitting wire pair helps minimize crosstalk generated in the UTP cable. However, significant crosstalk can occur at the end of the cable where the wire pairs are not twisted. Crosstalk can also occur at the plug contacts connected to the wire pairs. The magnitude of such crosstalk generally increases as the system speeds or system transmission frequencies increase. Thus, while early industry standards called for connecting hardware to provide NEXT loss of less than −36 dB at 16 MHz, category 6 systems are required to provide −54 dB at 100 MHz and −46 dB at 250 MHz.

Notwithstanding efforts to date, further devices, systems and methods for use in providing power over network transmission media are desired. In addition, devices, systems and methods that can be used in addressing the demand for high bandwidth and low noise while providing power over network transmission media are also desired. These and other objectives are met by the apparatus, systems, devices and methods described herein.

SUMMARY OF THE PRESENT DISCLOSURE

According to a first aspect of the present disclosure, an advantageous patch panel and power distribution system is provided. According to exemplary embodiments of the disclosed patch panel and power distribution system, the disclosed system includes a chassis, a connector assembly for connecting to first and second network transmission media, a power supply assembly for supplying output power and a controller, the connector assembly and the power supply assembly each being supported at least in part by the chassis, which is mountable to a rack.

In an exemplary embodiment of the present disclosure, a system and/or device is provided that includes a connector assembly for connecting to first and second network transmission media in combination with a power supply assembly that is supportable, at least in part, by the same chassis as that which supports the connector assembly. The disclosed system and/or device helps to eliminate and/or minimize, at least in part, the need to mount a power supply elsewhere in the rack (or in another rack), thereby helping to minimize the amount of rack space occupied by the overall system and, thus, helping to maximize the amount of rack space available for other devices, systems, wiring and/or work space within the rack.

According to another exemplary aspect of the present disclosure, a patch panel and power distribution system are provided that include a chassis, a connector assembly for connecting to first and second network transmission media, a power supply assembly for supplying at least one power supply voltage, and a controller, the connector assembly and the power supply assembly each being supported, at least in part by the chassis, which is mountable to a rack.

According to another exemplary aspect of the present disclosure, a patch panel and power distribution system are provided that include a connector assembly for connecting to first and second network transmission media, a power supply assembly for supplying at least one power supply voltage, and a controller, wherein the power supply and the first connector assembly are disposed within a 1U vertical portion of the rack. By providing a system that may be disposed in a 1U vertical portion of a rack as described herein, the amount of rack space occupied by the system is advantageously minimized, thereby helping to maximize the amount of rack space available for other devices, systems, wiring and/or work space within the rack.

According to another exemplary aspect of the present disclosure, a patch panel and power distribution system are provided that include a connector assembly for connecting to first and second network transmission media, a power supply assembly for receiving input power and supplying output power, and a controller, wherein the power supply and the first connector assembly are disposed within a volume having a vertical height of no greater than 1.75 inches. By providing a system that may be disposed in a volume having a vertical height of no greater than 1.75 inches, the amount of rack space occupied by the system is advantageously minimized, thereby helping to maximize the amount of rack space available for other devices, systems, wiring and/or work space within the rack.

According to another exemplary aspect of the present disclosure, a power distribution system is provided that includes a patch panel assembly for connecting to first and second network transmission media, a power supply assembly for providing at least one power supply voltage, and a controller for receiving at least one of the at least one power supply voltage, wherein the patch panel assembly is mountable to a rack and the power supply assembly is removably or detachably mountable with respect to the patch panel assembly after the patch panel assembly is mounted to the rack. By providing a power supply assembly that is removably or detachably mountable with respect to the patch panel assembly after the patch panel assembly is mounted to the rack offers numerous benefits, e.g., facilitating repair and/or replacement of the power supply. For example, in the event that the power supply assembly develops a malfunction or requires upgrade/maintenance, it can be detached/removed from the patch panel assembly without a requirement that the patch panel assembly be removed from the rack. Moreover, the ability to mount the power supply assembly after the patch panel assembly facilitates power supply upgrades without a requirement that the patch panel assembly be remove and reinstalled (along with all the connections thereto).

For example, the advantageous design/architecture of the present disclosure permits a patch panel assembly to be installed into a network and brought "on line" without a power supply assembly. The power assembly could be added to the system at a point in time thereafter, e.g., as needed. Moreover, it may be desirable, in at least some instances, to install a power supply assembly without taking the patch panel assembly "off line" (i.e., out of use) and/or shutting down the network. The advantageous design/architecture of the present disclosure enables devices/components connected through the disclosed patch panel assembly to continue to operate/communicate while a power supply assembly is installed. Furthermore, in the event that the power supply is to be removed and/or replaced, it may be desirable, in at least some instances, to do so without taking the patch panel assembly "off line" (i.e., out of use) and/or shutting down the network.

According to another exemplary aspect of the present disclosure, a patch panel and power distribution system is provided that includes a patch panel assembly for connecting to first and second network transmission media, a power supply assembly for providing at least one power supply voltage, and a controller for receiving at least one of the at least one power supply voltage, wherein the patch panel assembly is mountable to a rack and the controller is removably or detachably mountable with respect to the patch panel assembly after the patch panel assembly is mounted to the rack. By providing a controller that is removably or detachably mountable with respect to the patch panel assembly as described herein, repair and/or replacement of the controller is advantageously facilitated. For example, in the event that the controller develops a malfunction, it can be removed without a requirement to remove the patch panel assembly from the rack. Moreover, the ability to mount the controller after the patch panel assembly is positioned in the rack facilitates upgrade of the controller without a requirement to remove and reinstall the patch panel assembly (along with all the connections thereto).

For example, a patch panel assembly could be installed into a network and brought "on line" without a controller, which could be added thereafter. Moreover, it may be desirable, in at least some instances, to install a controller without taking the patch panel assembly "off line" (i.e., out of use) and/or shutting down the network. This would enable devices connected therethrough to continue to operate while the controller is installed. Furthermore, in the event that the controller is to be removed and/or replaced, it may be desirable, in at least some instances, to do so without taking the patch panel assembly "off line" (i.e., out of use) and/or shutting down the network.

According to another exemplary aspect of the present disclosure, a patch panel and power distribution system is provided that includes a patch panel assembly and a power supply assembly, the patch panel assembly having a first mounting assembly and a second mounting assembly laterally spaced from the first mounting assembly. The power supply assembly advantageously includes a mounting assembly that is removably or detachably mountable with respect to the first mounting assembly of the patch panel assembly and/or removably/detachably mountable with respect to the second mounting assembly of the patch panel assembly. By providing a power supply assembly that is removably/detachably mountable to either of two laterally offset mounting assemblies, the disclosed system advantageously facilitates access to and manipulation of different portions/regions of the patch panel assembly.

According to another exemplary aspect of the present disclosure, a patch panel and power distribution system is provided that includes a patch panel assembly and a power supply assembly, the power supply assembly being removably or detachably mountable with respect to the patch panel assembly in a first relative positioning of the power supply assembly and the patch panel assembly. The power supply assembly is further removably or detachably mountable with respect to the patch panel assembly in a second relative positioning of the power supply assembly relative to the patch panel assembly. The first and second relative positionings of the power supply assembly and the patch panel assembly are different. By providing a power supply assembly that is removably/detachably mountable with respect to the patch panel assembly in two different relative positionings of the power supply assembly and the patch panel, access and manipulation in different regions of the patch panel assembly are facilitated.

In an exemplary embodiment of the present disclosure, the patch panel assembly is adapted to supply DC power to DC powered devices over Ethernet transmission media. In such applications of the present disclosure, the patch panel assembly typically includes a plurality of ports (e.g., sixteen ports) and communicates with a DC power source. The DC power source typically has an output power capability selected to meet the maximum possible power demand based on the number of ports, although this is not required. The patch panel assembly may further include a control module that controls the supply of DC power to associated DC powered devices. The disclosed control module may itself be powered by the DC power source. The associated DC powered devices may take a variety of forms, as are known in the art, including but not limited to remote cameras, IP telephone sets and multimedia devices.

In a further exemplary embodiment of the present disclosure, the patch panel assembly includes a plurality of light emitting diodes (LED's) that are visible from the front of the patch panel and indicate relevant information concerning operation of the associated power distribution system, e.g., which of the ports are receiving DC power. Thus, in an exemplary embodiment, an illuminated LED indicates that DC power is being supplied to the corresponding port.

In another exemplary embodiment of the present disclosure, a control module is provided that includes electronics and/or programming that carry out and/or satisfy the requirements of IEEE 802.3af and TIA/EIA 568B.1-6 so as to ensure that power is not provided to a particular device via the network transmission medium unless the particular device requires such power.

In a further exemplary embodiment of the present disclosure, a double balance electrical noise reduction device facilitates insertion of DC power. The device may be advantageously used for high frequency transfer of data signals to interface connectors for unshielded twisted pair, i.e., UTP, media. The disclosed device generally utilizes a low reactance modular insert with two stage positive and negative compensation techniques to produce low noise characteristics. The device also allows for the insertion of DC power on signal lines without compromising system performance.

In an exemplary embodiment of the present disclosure, the disclosed UTP connector reduces connecting hardware cross-over talk (i.e., NEXT noise) and communicates with a high frequency DC power coupling device. The connector is advantageously designed so to have no substantial impact on (i.e., does not substantially lessen) the impedance characteristics of connected wire pairs below minimum Category 5e performance.

According to additional exemplary embodiments of the present disclosure, connecting hardware for use in telecommunication systems is provided, such connecting hardware being designed to reduce crosstalk, thereby improving the system's SNR performance. The disclosed connecting hardware advantageously allows for coupling of DC power by utilizing a low reactance modular insert that is electrically connected to a printed circuit board (PCB) which contains a positive and negative combination compensation technique. The disclosed compensation technique obviates the need for shielding or any other physical components. To achieve crosstalk reduction, the disclosed connecting hardware addresses noise issues at the interface connecting point, typically a matable plug that forms an electrical connection to a modular plug housing that contains electrical current conducting contact terminals. The disclosed system advantageously removes the coupled noise from adjacent lines associated with interface connecting points.

According to another exemplary aspect of the present disclosure, an apparatus and/or system for use in coupling power from a power supply to a device over a network transmission medium is provided. The disclosed power supply generally has a first terminal and a second terminal, the network transmission line includes first and second electrical conductors, and the disclosed apparatus/system includes: (i) a first device having a first winding and a second winding, the first winding being electrically connected between the first terminal of the power supply and the first electrical conductor of the network transmission medium, the second winding being coupled between the first terminal of the power supply and the first electrical conductor of the network transmission medium; (ii) a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium; and (iii) at least one core for coupling the first and second windings of the first device and for coupling the first and second windings of the second device.

According to another exemplary aspect of the present disclosure, an apparatus and/or system for use in coupling power from a power supply to a device over a network transmission medium is provided. The disclosed power supply generally has a first terminal and a second terminal, the network transmission line includes first and second electrical conductors, and the disclosed apparatus/system includes: (i) a first device having a first winding and a second winding, the first winding being electrically connected between the first terminal of the power supply and the first electrical conductor of the network transmission medium, the second winding being coupled between the first terminal of the power supply and the first electrical conductor of the network transmission medium; (ii) a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium; and (iii) at least one core for coupling the first and second windings of the first device and for coupling the first and second windings of the second device, wherein the at least one core includes a first core for coupling the first and second windings of the first device and for coupling the first and second windings of the second device.

In an exemplary embodiment according to the present disclosure, the at least one core includes a first core and the first and second windings of the first device each have at least one winding wound around the first core and the first and second windings of the second device each have at least one winding wound around the first core. In a further exemplary embodiment associated with the present disclosure, the at least one core includes a first core and the first and second windings of the first device are each wound around the first core and the first and second windings of the second device are each wound around the first core.

According to a further exemplary aspect of the present disclosure, an apparatus and/or system is provided for use in coupling power from a power supply to a device over a network transmission medium, the power supply having a first terminal and a second terminal, the network transmission line including first and second electrical conductors, and the apparatus/system including: (i) a first common mode choke having a first winding and a second winding, the first winding of the first common mode choke being electrically connected between the first terminal of the power supply and the first electrical conductor of the network transmission medium, the second winding of the first common mode choke being coupled between the first terminal of the power supply and the first electrical conductor of the network transmission medium; and (ii) a second common mode choke having a first winding and a second winding, the first winding of the second common mode choke being electrically connected between the first terminal of the power supply and the second electrical conductor of the network transmission medium, the second winding of the second common mode choke being coupled between the first terminal of the power supply and the second electrical conductor of the network transmission medium.

According to a still further exemplary aspect of the present disclosure, an apparatus or system for use in coupling power from a power supply to a device over a network transmission medium is provided, the power supply having a first terminal and a second terminal, the network transmission line including first and second electrical conductors, and the apparatus/system including: (i) a first transformer having a first winding and a second winding, the first winding of the first transformer being electrically connected between the first terminal of the power supply and the first electrical conductor of the network transmission medium, the second winding of the first transformer being coupled between the first terminal of the power supply and the first electrical conductor of the network transmission medium; and (ii) a second transformer having a first winding and a second winding, the first winding of the second transformer being electrically connected between the first terminal of the power supply and the second electrical conductor of the network transmission medium, the second winding of the second transformer being coupled between the first terminal of the power supply and the second electrical conductor of the network transmission medium.

According to another exemplary aspect of the present disclosure, an apparatus or system for use in providing power to a device over a network transmission medium is provided, the network transmission line including first and second electrical conductors, and the apparatus/system including: (i) a power supply having a first voltage terminal and a second voltage terminal, and (ii) a common mode choke having a first winding and a second winding, the first winding being electrically connected between the first voltage terminal of the power supply and the first electrical conductor of the network transmission medium, the second winding being coupled between the first voltage terminal of the power supply and the first electrical conductor of the network.

Additional advantageous structures, features and functions associated with the disclosed communication systems and methods, as well as the associated devices, systems and/or components for use in association therewith, will be apparent from the detailed description which follows, particularly when reviewed in conjunction with the figures appended hereto.

BRIEF DESCRIPTION OF THE DRAWINGS

To assist those of ordinary skill in the art in making and using the disclosed communications systems, devices and methods, reference is made to the appended figures wherein.

DETAILED DESCRIPTION OF EXEMPLARY EMBODIMENTS

According to the present disclosure, advantageous patch panel and power distribution systems are provided. Exemplary embodiments of the present disclosure include advantageous components, assemblies and sub-assemblies that may be employed in power distribution applications, e.g., power over Ethernet applications, as described herein. The disclosed components, assemblies, sub-assemblies and systems are particularly advantageous for inserting or introducing power to data communication line(s) in an efficient and reliable manner. Advantageous structural and functional aspects of the disclosed components, assemblies, sub-assemblies and systems, and methods for use thereof, will be apparent to persons skilled in the art from the detailed description which follows, particularly when read in conjunction with the appended figures.

Figure 1A:
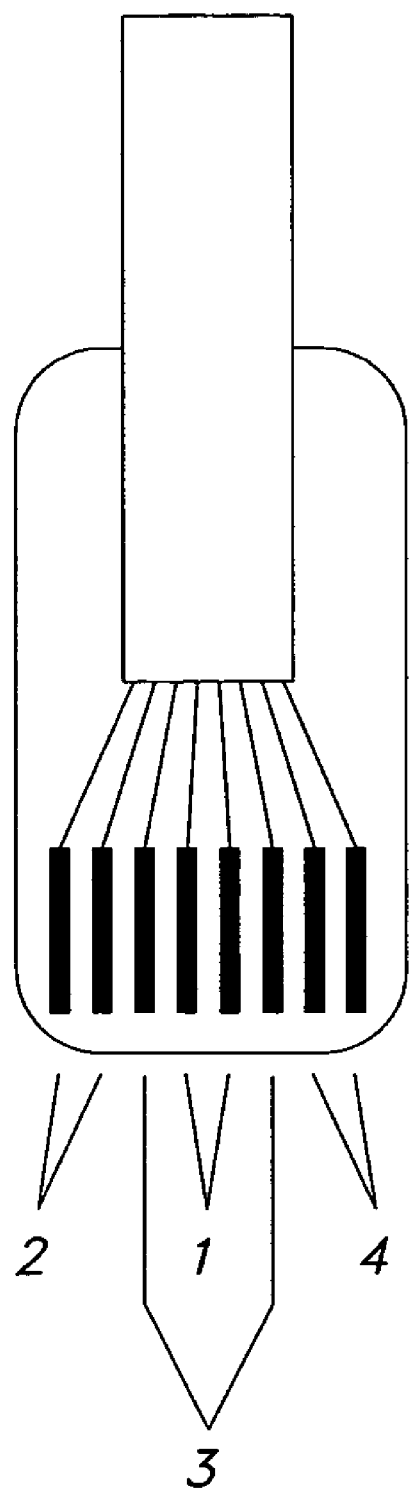
FIG. 1A is a schematic representation of an unshielded twisted pair (UTP) cable connected to an RJ45 telecommunication plug.
Figure 1B:
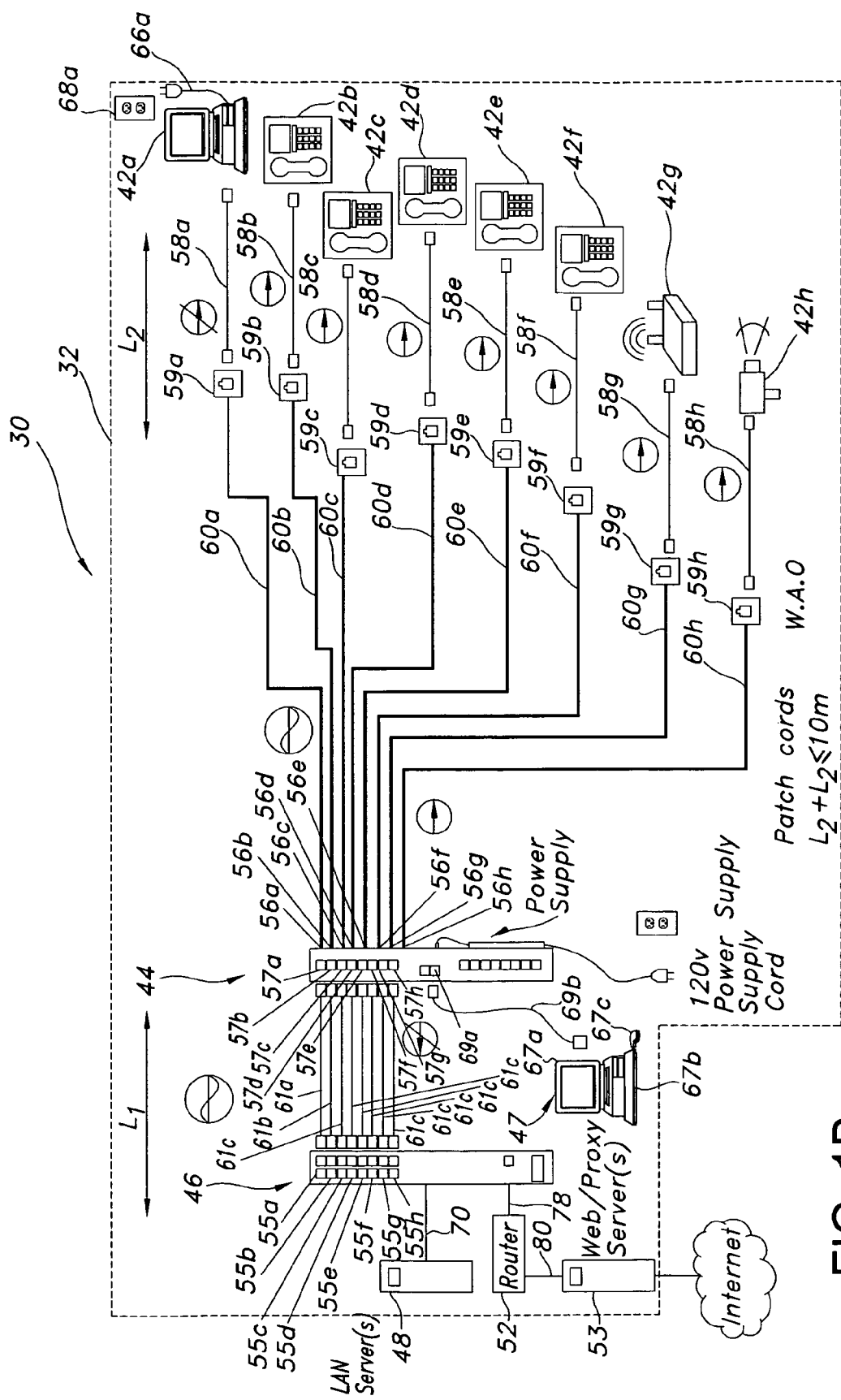
FIG. 1B is a block diagram representation of a communication system, in a partially disconnected state, having a patch panel and power distribution system in accordance with a first embodiment of one aspect of the present disclosure.

FIG. 1B is a block diagram representation of a communication system 30 in accordance with one embodiment of one aspect of the present disclosure. The communication system 30 includes a local area network 32 (LAN 32) which communicates with external network(s), e.g., the Internet 36. The LAN 32 includes a plurality of devices, including a computer 42a, Internet Protocol (IP) telephones 42b–42f, a wireless access point 42g, a surveillance camera 42h, a patch panel and power distribution system 44, a hub (or a switch) 46, a power manager 47, LAN server 48, a router 52 and a web/proxy server 53. As will be apparent to persons skilled in the art, exemplary LAN 32 may be modified to include additional devices (of the type described herein and/or of alternative design/functionality) and/or to include less than the number and types of devices depicted in FIG. 1B, without departing from the spirit or scope of the present disclosure.

According to the exemplary LAN 32 of FIG. 1B, each of the devices 42a–42h connects to the hub 46 via the patch panel and power distribution system 44. For example, the hub 46 includes ports 55a–55h. The patch panel and power distribution system 44 includes ports 56a–56h and ports 57a–57h. The computer 42a is connected to port 55a of the hub 46 via a path that includes network transmission medium 58a, wall mounted connector 59a, network transmission medium 60a, ports 56a and 57a of the patch panel and power distribution system 44 and network transmission medium 61a. Computer 42a is further connected to 120 VAC mains (not shown) via power cables 66a which plugs into wall mounted outlets 68a. IP telephone 42b is connected to port 55b of the hub 46 via a path that includes network transmission medium 58b, wall mounted connector 59b, network transmission medium 60b, ports 56b and 57b of the patch panel and power distribution system 44 and network transmission medium 61b. Similarly, IP telephone 42c is connected to port 55*c* of the hub 46 via a path that includes network transmission medium 58*c*, wall mounted connector 59*c*, network transmission medium 60*c*, ports 56*c* and 57*c* of the patch panel and power distribution system 44 and network transmission medium 61*c*. IP telephone 42*d* is connected to port 55*d* of the hub 46 via a path that includes network transmission medium 58*d*, wall mounted connector 59*d*, network transmission medium 60*d*, ports 56*d* and 57*d* of the patch panel and power distribution system 44 and network transmission medium 61*d*. IP telephone 42*e* is connected to port 55*e* of the hub 46 via a path that includes network transmission medium 58*e*, wall mounted connector 59*e*, network transmission medium 60*e*, ports 56*e* and 57*e* of the patch panel and power distribution system 44 and network transmission medium 61*e*. IP telephone 42*f* is connected to port 55*f* of the hub 46 via a path that includes network transmission medium 58*f*, wall mounted connector 59*f*, network transmission medium 60*f*, ports 56*f* and 57*f* of the patch panel and power distribution system 44 and network transmission medium 61*f*.

With further reference to FIG. 1B, wireless access point 42*g* is connected to port 55*g* of the hub 46 via a path that includes network transmission medium 58*g*, wall mounted connector 59*g*, network transmission medium 60*g*, ports 56*g* and 57*g* of the patch panel and power distribution system 44 and network transmission medium 61*g*. Camera 42*h* is connected to port 55*h* of the hub 46 via a path that includes network transmission medium 58*h*, wall mounted connector 59*h*, network transmission medium 60*h*, ports 56*h* and 57*h* of the patch panel and power distribution system 44 and network transmission medium 61*h*. Wall mounted connectors 59*a*–59*h* typically comprise RJ45 jack/plug type connectors.

In the exemplary embodiment of FIG. 1B, network transmission media 58*a*–58*h* and 60*a*–60*h* comprise electrically conductive network transmission media that may take the form of, for example, unshielded twisted pair (UTP) cable. UTP cable is commonly employed as LAN transmission media, e.g., Ethernet network transmission media. An RJ45 telecommunication plug is included on each end of network transmission media 58*a*–58*h*. Network transmission media 60*a*–60*b* have an RJ45 telecommunication plug on one end. The other end of network transmission media terminates at insulation displacement contacts defined by ports 56*a*–56*h* of the patch panel and power distribution system 44. The patch panel and power distribution system 44, network transmission media 60*a*–60*h*, the connectors 59*a*–59*h* and the network transmission media 58*a*–58*h* are sometimes collectively referred to as "structured cabling."

To further elucidate the subject matter of the present disclosure, FIG. 1A provides a schematic representation of an exemplary UTP cable connected to a T568B style RJ45 telecommunication plug. The UTP cable has four wire pairs, designated 1–4. In this four pair system, there are multiple wire pairs for data signal transmission. The plug has eight contacts, designated 1–8 as required for a FCC part 68 RJ45 telecommunication plug. The four wire pairs are connected to the eight contacts in accordance with the requirements of T568B. More particularly, the wires of wire pair 1 are connected to contact positions 4 and 5, respectively. The wires of wire pair 2 are connected to contact positions 1 and 2, respectively. The wires of wire pair 3 are connected to contact positions 3 and 6, respectively. The wires of wire pair 4 are connected to contact positions 7 and 8, respectively. The contacts may be used, for example, for tip (positive voltage) and ring (negative voltage) signal transmissions.

It is noted that the TIA/EIA Category 5e and 6 crosstalk or NEXT performance parameters include lower reactance, capacitance and inductance, as compared to an RJ45 plug that is rated for Category 5 performance. For Category 5e and 6 connecting hardware cabling systems, the EIA RJ45 wiring style is generally the preferred approach throughout the cabling industry. According to exemplary embodiments of the present disclosure, interface-connecting hardware, including a RJ45 modular jack, a printed circuit board (PCB), and an IDC terminal that also incorporate DC coupling circuitry are provided. The disclosed interface-connecting hardware advantageously removes coupled noise from RJ45 plug contact positions 3, 4, 5, and 6 that occur from the adjacency of the two pair arrangements and couples DC power to the appropriate signal pairs. It is noted that FIG. 1 illustrates that the worst case for a four pair RJ plug module is in the vicinity of pin positions 3, 4, 5 and 6, because both sides of the transmitting and receiving signals are adjacent to each other.

The patch panel and power distribution system 44 includes a power supply and a controller (not shown), e.g., a power over Ethernet (PoE) controller. The power supply is connected to 120 VAC mains (not shown) via power cable which plugs into wall mounted outlets 68*a*. Exemplary power manager 47 comprises a computer or processor 67*a* having a keyboard 67*b* and a mouse 67*c*. Power manager 47 connects to a port 69*a* of the patch panel and power distribution system 44 via network transmission medium 69*b*. The transmission medium 69*b* may be any type of network transmission medium, for example, an Ethernet network transmission medium and/or an RS232 transmission medium.

The LAN server 48, which typically includes one or more servers (e.g., a file server, an application server, an intranet server, a database server, a print server and/or a mail server for carrying out one or more LAN functions), connects to the hub 46 via network transmission medium 70. The router 52 connects to the hub 46 via network transmission medium 78 and connects to the web/proxy server(s) 53 via network transmission medium 80.

In operation, devices 42*a*–42*h* transmit, receive and/or process data via data communication elements/components of the LAN 32. The LAN server 48 typically stores programs and/or data for use by the devices 42*a*–42*h*. The router 52 forwards messages from the devices 42*a*–42*h* to the Internet 36 (or other associated network) via the web/proxy server(s) 53. The web/proxy server 53 generally performs website and domain name system (DNS) functions for messages sent from/to the Internet 34, as is well known in the art.

Of note, devices 42*a*–42*h* (i.e., computer 42*a*, IP telephones 42*b*–42*f*, wireless access point 42*g* and camera 42*h*) each require power for operation. Additional devices may also be associated with LAN 32 that require a supply of power. Computer 42*a* obtains power from the 120 VAC mains (not shown) via the cables 66*a* plugged into wall mounted outlets 68*a*. IP telephones 42*b*–42*f*, wireless access point 42*g* and camera 42*h* advantageously obtain power from the disclosed patch panel and power distribution system 44 via network transmission media 60*b*–60*h*, respectively. Thus, in addition to providing connections between various network transmission media and/or devices, the patch panel and power distribution system 44 of the present disclosure also supplies power over such media for the operation of network devices, e.g., wireless hubs 63–65 and IP telephones 42*e*–42*h*. Consequently, there is no need for wiring and/or circuitry to connect such devices, e.g., wireless hubs 63–65 and IP telephones 42*e*–42*h*, to a wall outlet connected to the 120 VAC mains (not shown) in order to provide such devices with power for operation. In exemplary embodiments of the present disclosure, the patch panel and power distribution system may includes electronics that are designed to ensure that power is provided to particular device(s) via a network transmission medium only under circumstances wherein the particular device requires a supply of power.

The patch panel and power distribution system 44 typically sends information to the power manager 47 via the network transmission medium 69b. This information from the system 44 may include information identifying the devices that are receiving power from the patch panel and power distribution system 44 and/or the amount of power being received by each of such devices. The system 44 may also receive information from the power manager 47, which may in turn be used for setup and/or control of the system. For example, the information from the power manager 47 may include commands that instruct the patch panel and power distribution system 44 to supply power to one or more of the devices. The information from the power manager 47 may also include commands that instruct the system 44 to stop supplying power to one or more of such devices. Notwithstanding the possible advantages of the power manager 47 in exemplary implementations of the present disclosure, it should be understood that the power manager 47 is not required for advantageous operation of the disclosed system.

Figure 2:
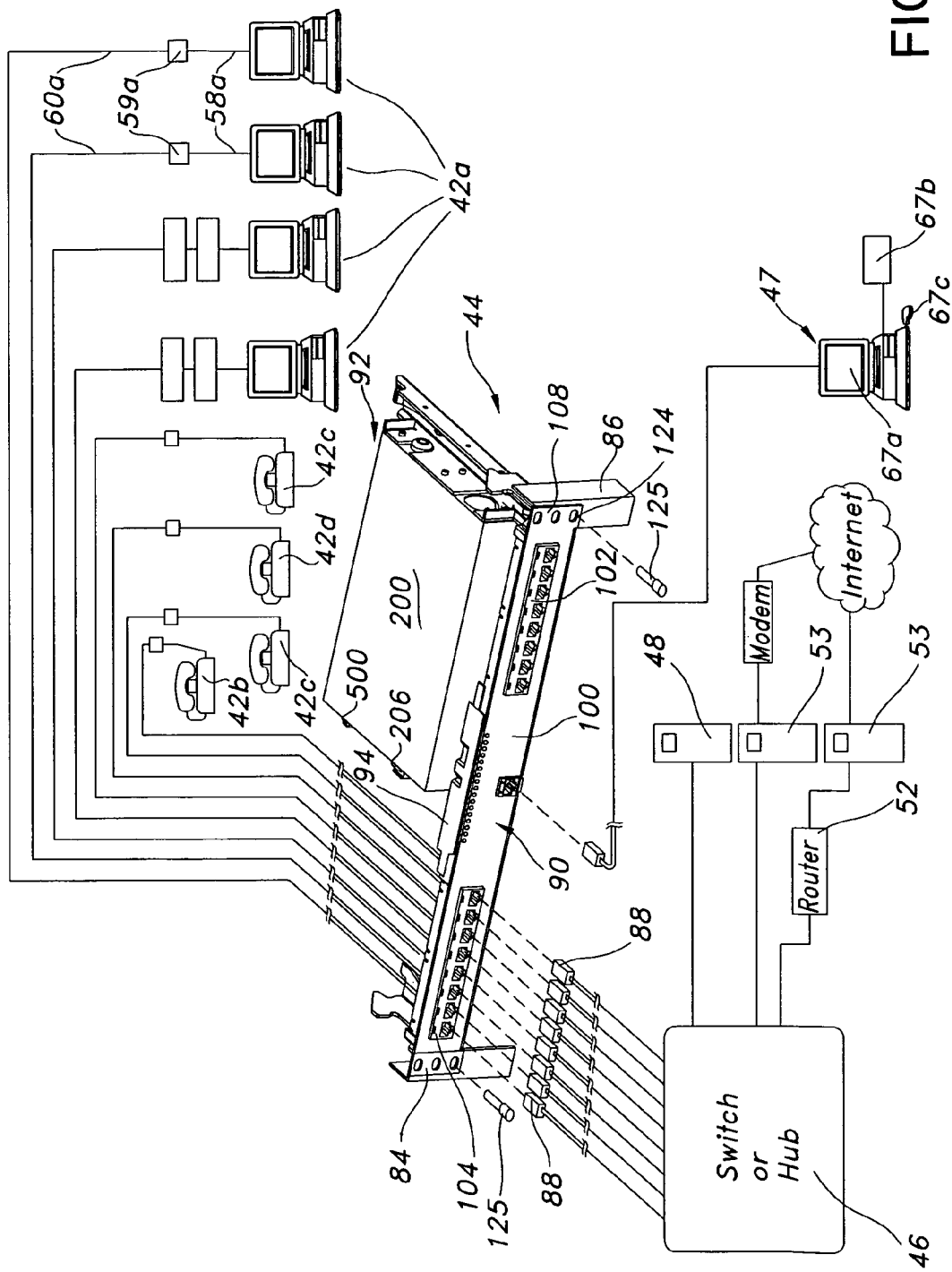
FIG. 2 is a front perspective view of a patch panel and power delivery system in communication with ancillary devices in accordance with another aspect of the present disclosure.
Figure 3:
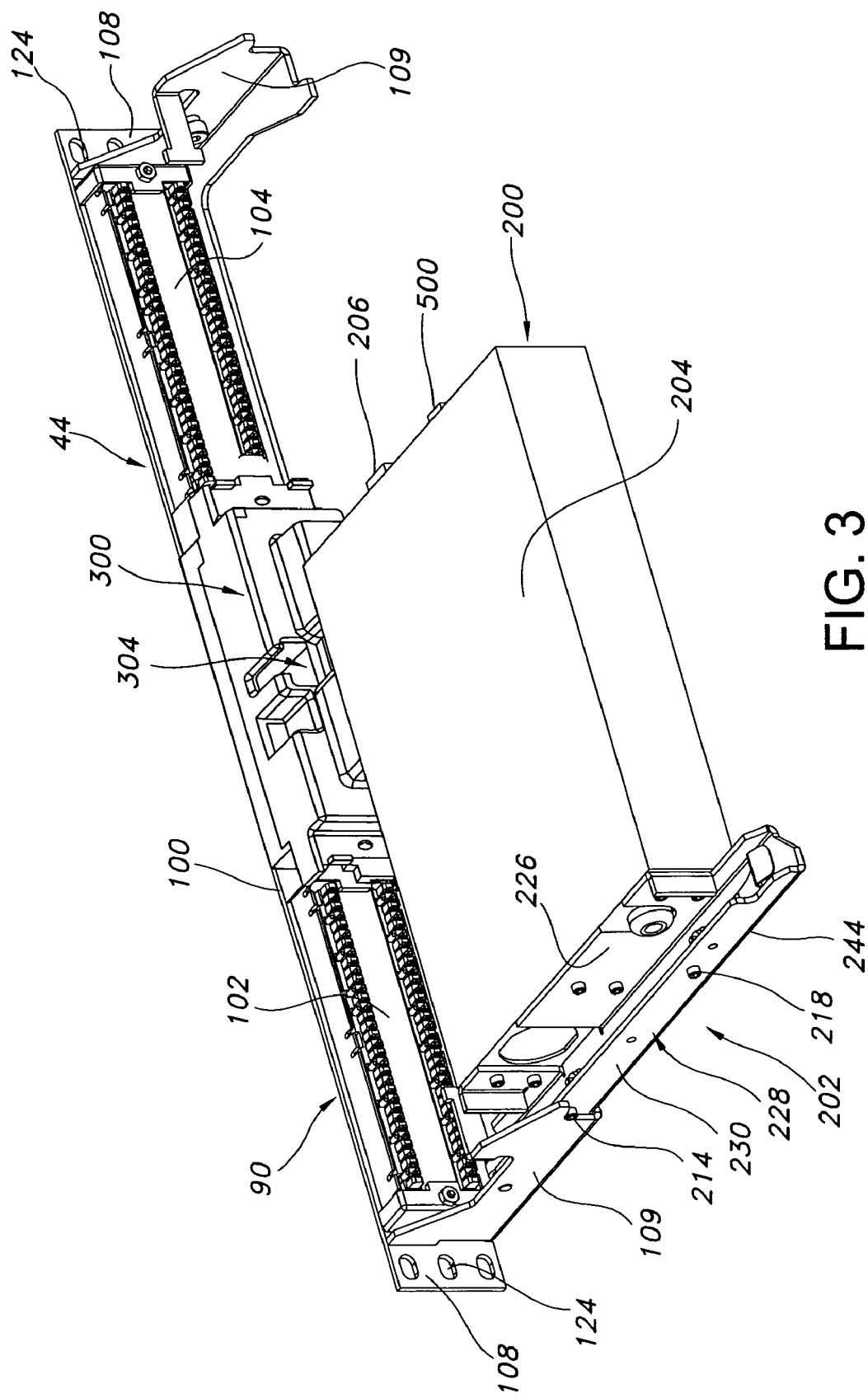
FIG. 3 is a rear perspective view of the patch panel and power delivery system of FIG. 2.
Figure 4:
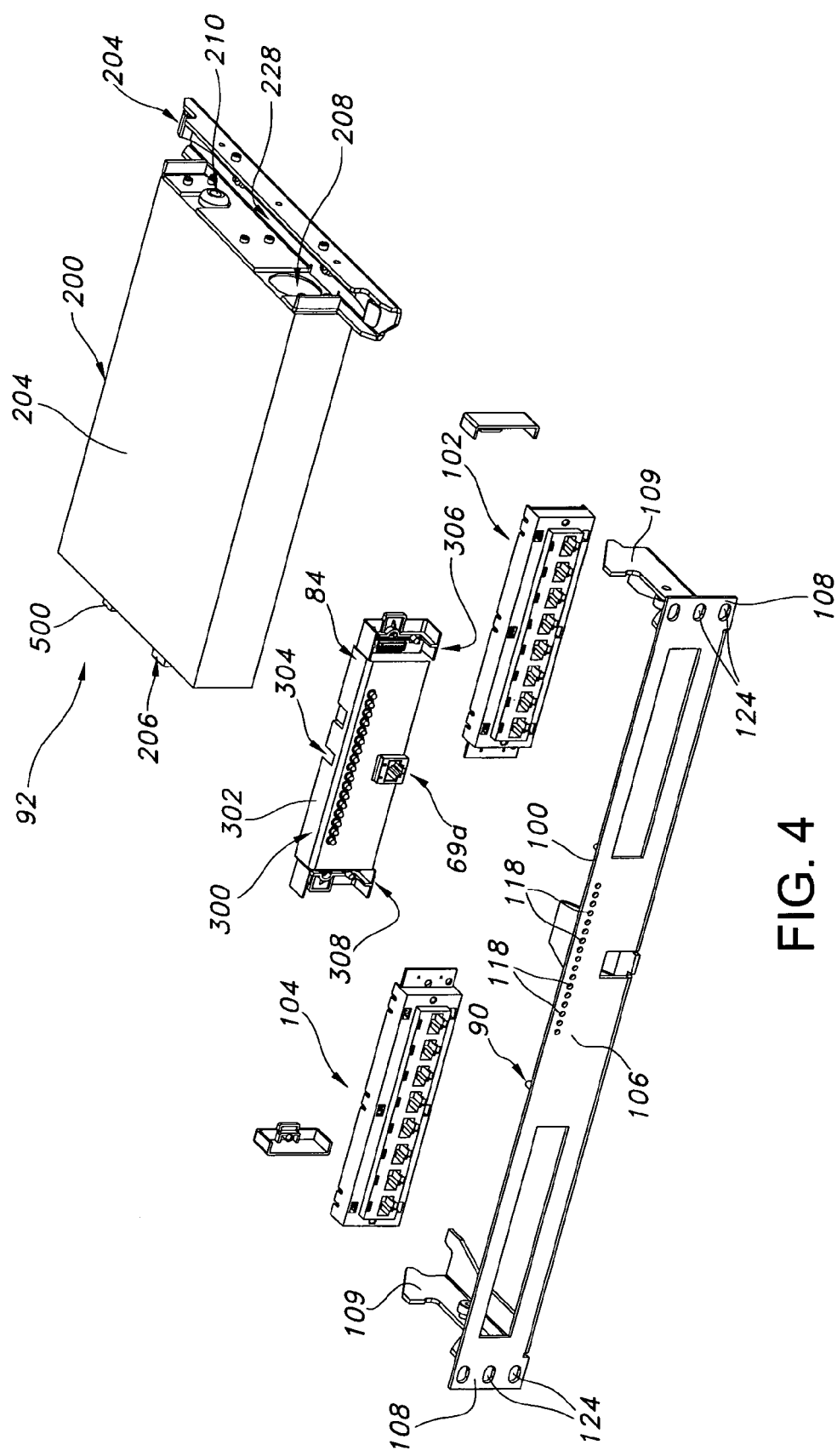
FIG. 4 is a front perspective view of the patch panel and power delivery system of FIG. 2 in a partially disassembled state.
Figure 5:
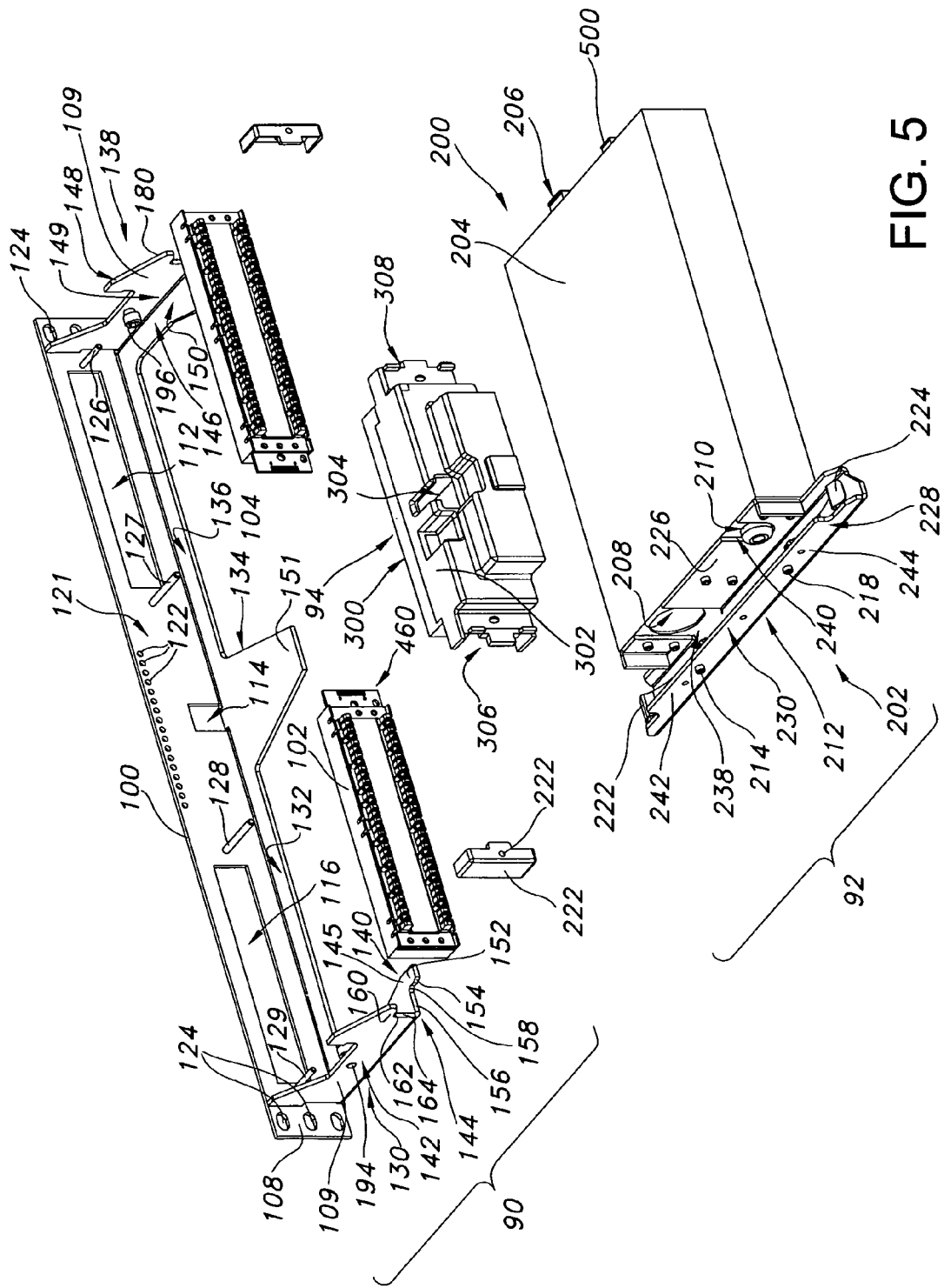
FIG. 5 is a rear perspective view of the patch panel and power delivery system of FIG. 2 in a partially disassembled state.

FIGS. 2–5 are schematic views of an exemplary embodiment of the disclosed patch panel and power delivery system 44 of the present disclosure (with associated devices communicating therewith in the schematic view of FIG. 2). In this exemplary embodiment, the patch panel and power delivery system 44 is adapted to be oriented generally horizontally and mounted to support members 84, 86 of an equipment rack (not shown). The rack may be a conventional equipment rack, e.g., a 19 inch rack in compliance with one or more standards for mounting components, such as electronic industry association recommended standard 310, commonly referred to as EIA RS-310. The vertical space within an EIA RS-310 compliant rack system is generally defined in terms of vertical rack mounting unit increments, often referred to as RMU's or simply U's. For example, a "1U" component is sized to fit within a "1U" vertical space of the rack. For EIA RS-310 racks, one mounting unit or "1U" is defined as 1.75 inches. A "2U" component is sized to fit within a 2U vertical space. A "24U" rack and a "72U" rack are sized to have 24U and 72U, respectively, of usable vertical space. In the schematically disclosed embodiment of FIGS. 2–5, the rails have at least three mounting slots within each U of vertical space for attachment and/or positioning of components.

Exemplary patch panel and power delivery system 44 according to the present disclosure includes a patch panel assembly 90, a power supply assembly 92 and a controller assembly 94. As will be further described hereinafter, in this exemplary embodiment, the overall system is advantageously modular in design, such that the patch panel assembly and power distribution system facilitate installation and/or removal of the power supply assembly 92 and the controller assembly 94 without a need to remove the patch panel assembly 90 from the rack, i.e., from engagement with supports 84, 86. The ability to independently access and remove/replace the power supply assembly 92 and the controller assembly 94 make it significantly easier to maintain, upgrade and/or repair the patch panel and power delivery system 44 of the present disclosure.

The patch panel assembly 90 includes a chassis 100, a first connector assembly 102 and a second connector assembly 104. The chassis 100 detachably supports the connector assemblies 102, 104, the power supply assembly 92 and the controller assembly 94, at least in part. The chassis is preferably fabricated from a rigid material, e.g., steel. The chassis 100 includes a front panel or face 106, mounting brackets 108 and power supply support(s) 109. In addition, the front panel defines openings 112, 114, 116 for receipt of and access to the first connector assembly 102, the second connector assembly 104 and the controller assembly 94, respectively. The front panel 106 also defines a plurality of openings 118 to receive forward portions 120 of light pipes 121. As further described hereinafter, light pipes 121 define rear portions 122 in light communication with LED's that are typically mounted on or with respect to the controller assembly 94. The mounting brackets 108 may be integral with the front panel 106 or otherwise mounted with respect to front panel 106, and typically define a plurality of openings 124 for receiving fasteners 125 for mounting the chassis 100 to the support members 84, 86 of the rack. Exemplary chassis 100 further defines rearwardly directed rod-like supports 126, 127 for mounting the first connector assembly 102 and rearwardly directed rod-like supports 128, 129 for mounting the second connector assembly 104.

The power supply support(s) 109 are configured and dimensioned to support the power supply assembly 92, at least in part, while the power supply assembly 92 is associated with and mounted with respect to the chassis 100 of system 44. More specifically and as further described hereinafter, the power supply support(s) 109 are designed to support the power supply assembly 92, at least in part, in at least two alternative orientations relative to the chassis 100 of patch panel assembly 90.

In the exemplary embodiment of FIGS. 2–5, power supply support(s) 109 include a bracket 130, flanges 132, 134, 136 and bracket 138. The bracket 130 allows the power supply assembly 92 to be mounted in register with the second connector assembly 104, which advantageously minimizes obstructions and maximizes clearance behind the first connector assembly 102, i.e., the opposite connector assembly, thereby facilitating access to the rear portion of the first connector assembly 102. The bracket 138 allows the power supply assembly 92 to alternatively be mounted in register with the first connector assembly 102, which advantageously minimizes obstructions and maximizes clearance behind the second connector assembly 104, thereby facilitating access to the rear portion of the second connector assembly 104.

More specifically, exemplary bracket 130 includes sides 140, 142 and apex 144. The side 140 is oriented generally horizontally and defines a support surface 145 that is configured and dimensioned to support the power supply assembly 92, at least in part, while the power supply assembly 92 is mounted with respect to or supported by the bracket 130. Similarly, exemplary bracket 138 includes sides 146, 148 and apex 149. The side 146 is oriented generally horizontally and defines a support surface 150 that is configured and dimensioned to support the power supply assembly 92, at least in part, while the power supply assembly 92 is mounted with respect to or supported by the bracket 138. Rearwardly directed horizontal flange 134 is laterally spaced from the bracket 130 and bracket 132 and defines a support surface 151. Flange 132 extends laterally between the bracket 130 and the flange 134 to add rigidity. Likewise, flange 136 extends laterally between the flange 134 and the bracket 138. Flanges 132, 134, 136 may be advantageously formed integrally with chassis 100 or otherwise fixedly mounted with respect to chassis 100, e.g., by welding, bolting or the like.

Side 140 of bracket 130 generally includes a rear portion that defines an extension portion 152 and abutment surfaces 154, 156. The abutment surfaces 154, 156 are oriented at an angle relative to one another (e.g., the abutment surface 154 is generally laterally facing and abutment surface 156 is generally rearwardly facing) and meet at a radiused corner 158. Side 142 of bracket 130 generally includes a rear portion that defines an extension portion 160 and abutment surfaces 162, 164. The abutment surfaces 162, 164 are oriented at an angle relative to one another (e.g., the abutment surface 162 is generally downwardly facing and abutment surface 164 is generally rearwardly facing) and meet at a radiused corner 166. At the opposite end of chassis 100, bracket 138 includes comparable structural features.

Exemplary power supply support(s) 109 further define catch portions that are adapted to restrain or control/modulate movement of the power supply assembly 92 while the power supply assembly is mounted to the bracket 130, 138. In the exemplary embodiment of FIGS. 2–5, the catch portions are defined by shoulder screws 194, 196. Each of the shoulder screws comprises a threaded shank and a cylindrical head defining an upper surface. The shoulder screws 194, 196 are received by threaded bores defined by or formed in brackets 130, 138, such that the upper surfaces of the heads of shoulder screws 194, 196 are positioned in a generally lateral orientation.

The power supply assembly 92 generally includes a power supply 200 and a mounting assembly 202. The power supply 200 generally includes a housing 204 and electrical components (mounted within the housing) for receiving input power and generating power supply voltages therefrom. The power supply 200 further includes at least one output port 206 (e.g., an electrical connector) having contacts connected to terminals within the power supply. In input port 500 is typically associated with power supply 200. According to exemplary embodiments of power supply 200, the input port 500 includes three terminals, with two adapted to be connected to a power source and the third adapted to be connected to ground. The voltages generated by the power supply are typically used in powering remote devices as well as other electronics in communication with patch panel and power distribution system 44. The housing 204 generally defines at least one opening 208 for air flow in/out of the housing 204 to help cool the electrical components positioned therein. An accessible fuse assembly 210 is typically mounted with respect to the housing 204. According to exemplary embodiments of the present disclosure, a commercially available power supply may be utilized as part of the disclosed system, e.g., a power supply available from Mean Well Enterprises Co., Ltd (Taipei, Taiwan) as model DP-130OR or DP-260OR. Alternative power supplies may be utilized without departing from the spirit or scope of the present disclosure.

In the exemplary embodiment of FIGS. 2–5, the mounting assembly 202 includes two cooperating portions: a first portion for mounting the power supply to bracket 130 and a second portion for mounting the power supply to the bracket 138. More specifically, the mounting assembly 202 includes a bracket 212, shoulder screws 214, 218 and catch assemblies 222, 224. The bracket 212 includes a base 228. Upstanding side 226 of bracket 212 is secured to the housing 204 of the power supply assembly 92 and defines openings/slots so as to avoid obstructing access to the fuse assembly 210 and air flow to/from the opening 208. The base 228 defines first and second mounting surfaces 242, 244, each of which is generally downwardly facing. The first mounting surface 242 is adapted to contact/engage the support surface 145 while the power supply assembly 92 is mounted to the bracket 130. The second mounting surface 244 is adapted to contact/engage the support surface 150 while the power supply assembly 92 is mounted to the bracket 138, i.e., when the bracket is oppositely oriented.

Each of the shoulder screws 214, 218 includes a threaded shank and a cylindrical head defining a circumferential surface and top surface. With the power supply assembly 92 mounted with respect to the chassis 100 of the system 44, the top surfaces of shoulder screws 214, 218 are oriented generally laterally. Circumferential surface of shoulder screw 214 defines abutment surfaces for substantially abutting the abutment surfaces 162, 164 defined by the side 140 while the power supply assembly is mounted to the bracket 130. The catch assemblies 222, 224 generally define oppositely directed, spring biased catch members. The first catch assembly 222 is adapted to engage the head portion of shoulder screw 194 while the power supply assembly 200 is mounted with respect to the bracket 130. In like manner, the second catch assembly 224 engages the head of shoulder screw 196 while the power supply assembly 200 is mounted with respect to the bracket 138.

According to exemplary embodiments of the present disclosure, to mount the power supply assembly 200 to the bracket 130 of the patch panel assembly 90, the power supply assembly 200 is first positioned on the support surface defined by the mounting bracket 130 of the patch panel assembly. Thereafter, the power supply assembly is moved forwardly (e.g., by pushing) and the catch portion is biased upwardly (so as to allow the catch portion associated with the mounting assembly 202 to clear the corresponding catch portion associated with the patch panel assembly). The upward bias on the catch portion may be applied manually or mechanically, e.g., by virtue of a guide designed into the patch panel and/or power supply assemblies. The forward movement of the power supply assembly causes the abutment surfaces of the power supply assembly to substantially abut the abutment surfaces of the bracket 130 of the patch panel assembly. Thereafter, the upward bias on the catch portion ceases (once the structures have cleared their interference position) and the catch portion moves to an engagement position, thereby releasably engaging the catch portion of the patch panel assembly.

To remove the power supply assembly 200 from the bracket 130, the catch portion of the patch panel assembly is upwardly biased to disengage the catch portion of the mounting assembly 202 from engagement with the catch portion of the patch panel assembly 90. The power supply assembly is thereafter moved rearwardly (e.g., by pulling). If desired, the power supply assembly 200 may be separated from the patch panel assembly, i.e., by sliding the mounting assembly off of the support surface defined by the mounting bracket 130. The procedure for mounting the power supply assembly to the bracket 134 of the patch panel assembly is similar to the procedure for mounting the power supply assembly to the bracket 130 except that, in order to mount the power supply assembly to the bracket 134, the power supply assembly is rotated 180° and positioned on the support surface defined by the bracket 134.

The controller assembly 94 generally includes a controller 300 that includes an outer housing 302 and, as further described hereinafter, control electronics, e.g., electronics that operate in compliance with the requirements of IEEE 802.3af and TIA/EIA 568B.1-6. According to exemplary embodiments of the present disclosure, the control electronics incorporated into controller 300 operate so as to ensure that power is not provided to a particular device via the network transmission medium unless the particular device requires such power. The housing 302 generally defines four ports: an input port 304, two output ports 306, 308 and the communication port 69a. The input port 304 is generally defined by or positioned in an upper rear portion of the housing 302. The input port 304 is typically adapted to receive a cable connected to the output port 206 of power supply 200. The first output port 306 is generally defined by or positioned in a lateral side portion of the housing 302 and is typically adapted to receive an electrical connector that extends from the first connector assembly 102. The second output port 308 is generally defined by or positioned in an opposite lateral side portion of the housing 302 and is adapted to receive an electrical connector that extends from the second connector assembly 104. The communication port 69a is generally defined by or positioned in a front portion of the housing 302 and is adapted to receive the network transmission medium 69b. As noted previously, network transmission medium 69b is generally connected to the power manager 47 (FIG. 1B).

As noted above, in exemplary embodiments of the present disclosure, the controller assembly 94 includes electronics that carry out the requirements of IEEE 802.3af and TIA/EIA 568B.1-6 so as to make sure that power is not provided to a particular device via the network transmission medium unless the particular device requires such power. According to exemplary embodiments hereof, the disclosed controller 94 includes two printed circuit board (PCB) assemblies, where one of which may be sourced from PowerDsine, Inc. (Hod Hasharon, Israel), e.g., a model PD67024MUAC controller. The PD67024MUAC controller typically implements various functions in accordance with IEEE 802.3af-2003, e.g., discovery, classification, port real-time protection and system level functions, such as, for example, power management and management information base (MIB) support. The second PCB assembly may take the form of a mother-board with a plurality of connectors, including a first connector adapted to electrically connect to the cable received by the input port 304, a second connector adapted to electrically connect to the connector received by the first output port 306, a third connector adapted to electrically connect to the connector received by the second output port 308, a fourth connector adapted to electrically connect to the network transmission medium received by the communication port 69a, and a fifth connector adapted to electrically connect to the first PCB assembly.

The mother-board PCB assembly may further advantageously include a plurality of conductors that provide connections between the foregoing plurality of connectors as well as a plurality of indicators, e.g., light emitting diodes (LED's). Each of the indicators may be advantageously associated with a respective one of the ports and, based on such association, the LED's may operate to indicate whether the system is supplying power to such port. In the installed state, the mother-board assembly is typically oriented parallel to the front panel 106 of the chassis 100 and the printed circuit board of the PD67024MUAC controller is typically oriented perpendicular to the printed circuit board of the mother-board assembly. However, the precise physical orientations of the PCBs is not critical to the operation and/or performance of the disclosed controller, as will be readily apparent to persons skilled in the art, and alternative PCB combinations, arrangements and orientations may be employed without departing from the spirit or scope of the present disclosure.

According to further exemplary embodiments of the present disclosure, a modified version of a dial in memory module (DIMM) controller may be employed, e.g., a modified module that eliminates, or adds to, the controller functions described above. For example, the power supply may be configured and/or selected so as to be adapted to supply maximum power to all of the ports simultaneously. In such embodiments, there may be no need for the controller to implement the classification function portion of IEEE 802.3af-2003. Thus, for example, the DIMM controller may be modified by modifying software and/or firmware resident within the DIMM controller. Additional and/or alternative DIMM controller modifications may be implemented, as will be apparent to persons skilled in the art, without departing from the spirit or scope of the present disclosure. Indeed, in exemplary embodiments of the present disclosure, the controller 94 may be of the type disclosed in U.S. Pat. No. 6,218,930 to Katzenberg et al., the disclosure of which is incorporated by reference herein.

Figure 6:
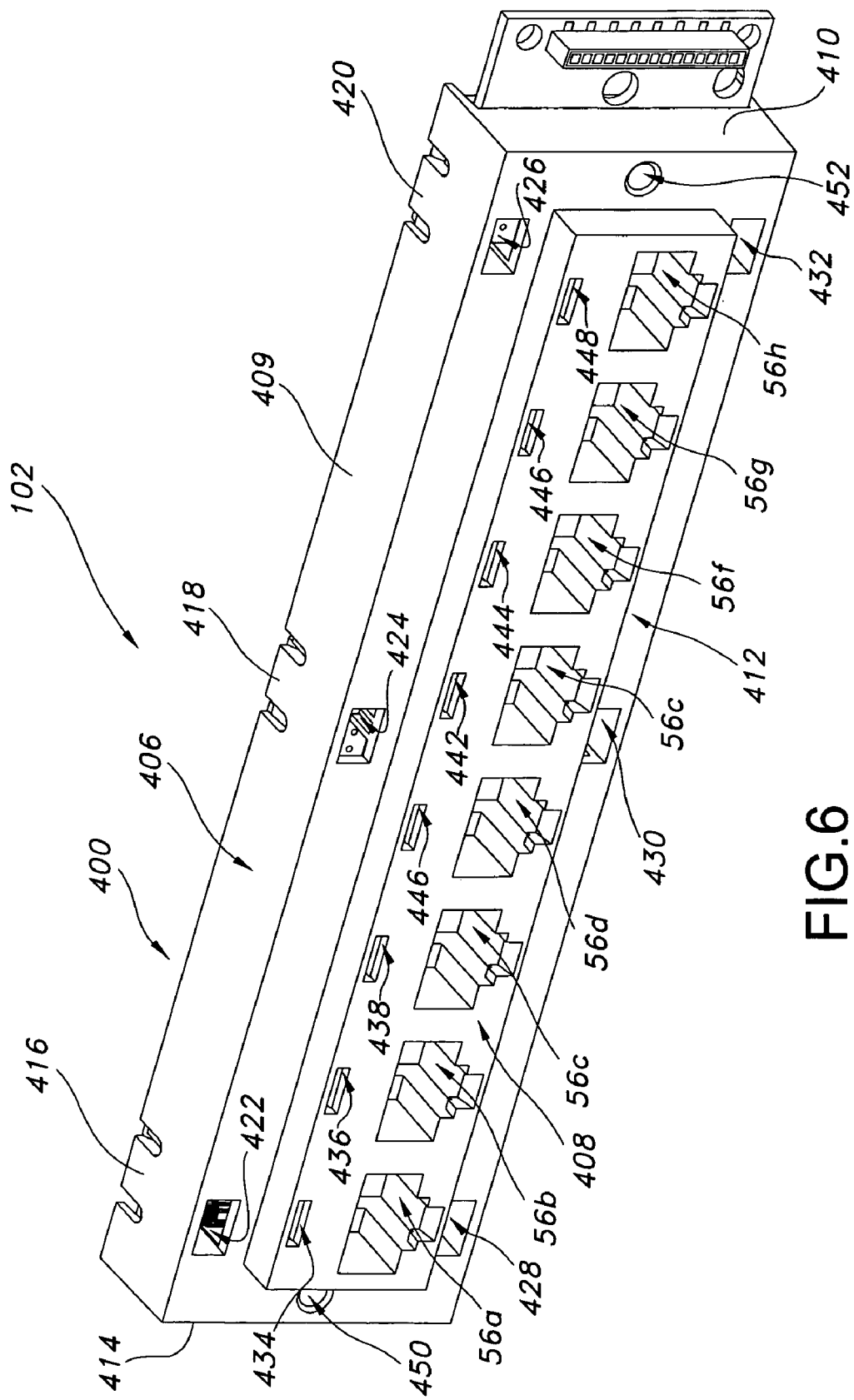
FIG. 6 is a front perspective view of a connector module of the patch panel and power delivery system of FIG. 2.
Figure 7:
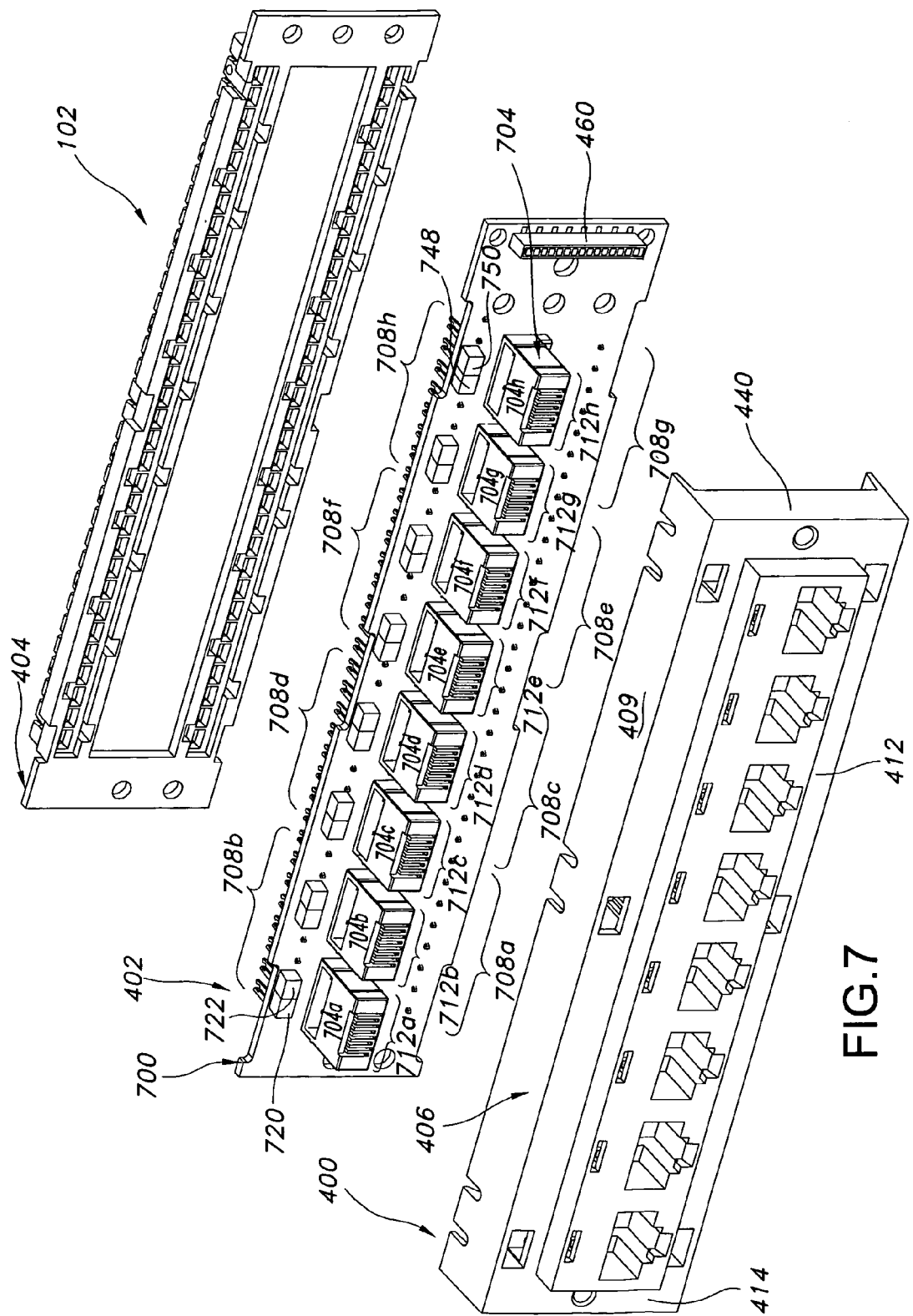
FIG. 7 is front perspective view of the connector module of FIG. 6 in a partially disassembled state.

With reference to FIGS. 6–7, schematic views of an exemplary embodiment of a first connector assembly 102 are provided. As shown in FIGS. 6–7, the disclosed embodiment of the first connector assembly 102 includes a forward housing portion 400, an insert portion 402 and a rear housing portion 404. The forward housing portion 400 includes a main body 406 and a projection face 408. The main body 406 is generally rectangular and includes walls 409, 410, 412, 414 that define an opening for receiving the insert portion 402 of the first connector assembly 102. The walls 409, 412 further define snap members, e.g., snap members 416, 418, 420, for releasably locking the rear housing portion 404 of the connector assembly 102 to the forward housing portion 400 of the connector assembly 102. Also shown are tooling openings 422, 424, 426, 428, 430, 432 that are typically employed in manufacture of the forward housing portion 400.

The projection face 408 is generally rectangular and dimensioned substantially complementary to the opening defined by the front panel 106 of the chassis 100 of the patch panel assembly 90. The projection face 408 typically defines a linear array of jack ports, e.g., ports 56a–56h, that define openings for receiving mating plug connectors (see, e.g., connectors 88 in FIG. 1B). The jack ports and mating plugs may be, for example, of conventional design and performance, e.g., CAT 5E and/or CAT 6. The projection face 408 may further define openings 434, 436, 438, 440, 442, 444, 446, 448 to receive inserts (not shown) having icons or other indicia formed or printed thereon. The use of inserts to provide indicia facilitates interconnections that users desire to effect, while avoiding the potentially expensive and difficult process of printing or otherwise defining appropriate indicia directly on the connector assembly. In the disclosed embodiment, the inserts are typically fabricated with a rectangular body (to match up with the openings 434-448 formed in the connector assembly). In other exemplary embodiments of the present disclosure, the openings 434-448 may be replaced by comparable openings below the linearly aligned ports of the connector assembly or by alternative means/mechanisms for displaying appropriate indicia associated with the respective ports.

The main body 406 of the forward housing portion 400 is generally of larger dimension than the projection face 408, thereby allowing the connector assembly 102 to be secured relative to the chassis when introduced from the rear thereof.

In that regard, exemplary main body 406 defines apertures 450, 452 adjacent the walls 410, 414 to receive connector assembly supports 128, 129, respectively, that extend from the chassis 100. One or more retainers 454 are typically employed to retain the first connector assembly 102 on the supports 128, 129. Each retainer 454 typically defines an opening 456 adapted to receive one of the connector assembly supports 128, 129 when assembled onto the rear thereof. The retainer(s) 454 are generally secured in place by fasteners or other appropriate devices/mechanisms. The first connector assembly 102 further defines an input power port 460 which is typically used to connect with the port 306 of the controller assembly 94.

With further reference to FIGS. 6–7, the exemplary insert portion 402 of the connector assembly 102 includes a printed circuit board 700, a plurality of connector inserts 704a–704h, a plurality of groups of insulation displacement contacts 708a–708h that extend from the exterior surface thereof, and a plurality of coupler circuits indicated generally by 712a–712h. The plurality of connector inserts 704a–704h are typically mounted to the printed circuit board 700 and are generally of conventional design. In the disclosed exemplary embodiment of FIGS. 6–7, each connector insert includes an RJ45 connector insert having a dielectric support member and eight elongated members disposed thereon. Each of the plurality of elongated members typically defines a contact portion and a terminal portion. The plurality of connector inserts 704a–704h may be arranged in a linear array (as shown) so as to place each of the connector inserts 704a–704h in register with a respective one of the ports 56a–56d. Further details of exemplary connector inserts for use according to the present disclosure are disclosed in commonly assigned U.S. Pat. No. 6,802,743, entitled "Low Noise Communication Modular Connector Insert," and U.S. application Ser. No. 09/982,073, entitled "Dual Reactance Low Noise Modular Connector Insert," the contents of which are hereby incorporated by reference in their entireties.

The groups of insulation displacement contacts (IDC's) 708a–708h are also typically mounted to the printed circuit board 700. Each of the IDC groupings 708a–708h includes eight IDC's. The IDC groups 708a–708h generally correspond to ports 57a–57h, respectively, and the IDC's are generally of conventional design. Each IDC typically includes an elongated member defining a contact portion and a terminal portion. The contact portion is generally adapted to receive a single wire, as is known in the art. The IDC groups are generally arranged in two linear arrays so as to place each of the groups approximately in register with a respective one of the ports 56a–56d. If twisted pair wiring is used, pair twists are generally maintained to within 12 inch of the point of termination (to the contact portion of the IDC) for enhanced data performance.

According to exemplary embodiments of the present disclosure, each coupler circuit 712a–712h may be fabricated in accordance with coupler circuit 550, which is described below with reference to FIG. 11. Accordingly, each coupler circuit according to the present disclosure typically includes two common mode choke assemblies, e.g., common mode choke assemblies 720–722 (described hereinafter), and eight capacitors. Four of such capacitors comprise discrete capacitors, e.g., discrete capacitors 761–764 (see FIG. 13) mounted to the printed circuit board 700. The other four of such capacitors are formed by closely spaced conductive portions, e.g., capacitors 801–804 (see FIGS. 14A–14D), of the printed circuit board 700. Additional details regarding exemplary coupler circuit designs, structures and functionalities are set forth hereinbelow.

Rear housing portion 404 is configured and dimensioned to cooperate with the rearwardly directed IDC's, providing conventional housing elements with aligned slots/openings to facilitate operation/functionality of the IDC's. The rear housing portion 404 defines the rearward face of first connector assembly 102. Outwardly extending flanges generally facilitate mounting of first connector assembly 102 relative to chassis 100. The design and operation of second connector assembly 104 are typically comparable to first connector assembly 102. However, it is to be noted that the disclosed patch panel assembly may be assembled with only one connector assembly, e.g., eight ports, without departing from the spirit or scope of the present disclosure. Thus, for example, the portion/side of the patch panel assembly 90 that is devoid of a connector assembly may be advantageously employed for mounting of a power supply assembly 92, as described herein. Thus, the patch panel and power delivery system of the present disclosure offers significant flexibility/versatility in potential modes of implementation and use.

Figure 8:
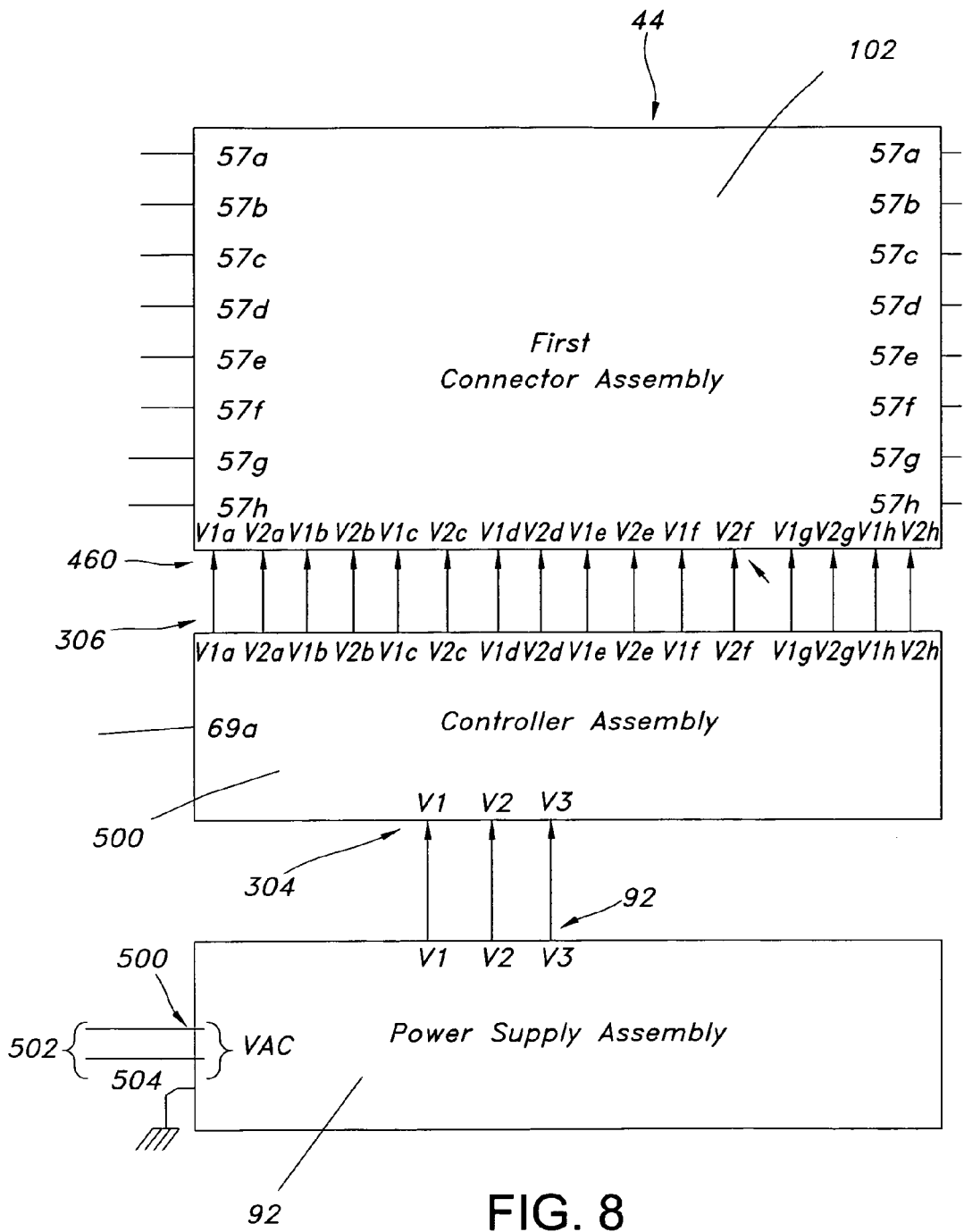
FIG. 8 is a block diagram representation of an electrical configuration used in one embodiment of the patch panel assembly, the power supply assembly and the controller assembly of FIG. 2.

With reference to FIG. 8, a block diagram representation of an electrical configuration according to an exemplary aspect of the present disclosure is set forth. The electrical configuration of FIG. 8 may be advantageously employed according to exemplary embodiments of the disclosed patch panel and power delivery system, e.g., a system that includes, inter alia, a patch panel assembly, power supply assembly and controller assembly. In the exemplary embodiment of FIG. 8, the system 44 is provided with a power supply assembly 92 that includes an input port 500 and output port 206 (see FIGS. 2–5). The input port 500 includes three input terminals. Two of the input terminals, VAC, are adapted to be connected to an input power source (e.g., the 120 VAC mains) via a power cable 502. The third input terminal is adapted to be connected to an earth ground 504. The output port 206 includes three output terminals, V1, V2, V3. The first and second output terminals, V1, V2, supply first and second power supply voltages, respectively, e.g., 48 volts direct current (VDC) and 0 VDC (sometimes referred to as COMMON), for use in powering remote devices such as, for example, remote devices 42e–42h (see FIG. 1B) and/or wireless hubs. The third terminal, V3, supplies a third power supply voltage, e.g., 5 VDC (referenced to 0 VDC), for use in powering devices/components in one or more circuits within the patch panel and power distribution system 44.

The controller assembly 94 includes the input port 304, the output port 306, and the communication port 69a. The input port 304 includes three input terminals V1, V2, V3. The first and second input terminals, V1, V2, are connected to the first and second output terminals, V1, V2, respectively, of the power supply 92 and are adapted to receive first and second power supply voltages, e.g., 48 VDC and COMMON, supplied therefrom. The third terminal is connected to the third output terminal, V3, of the power supply assembly 92 and is adapted to receive the third power supply voltage, e.g., 5 VDC, supplied therefrom. The controller assembly 94 typically uses the third power supply voltage to power one or more circuits within the controller 300.

The output port 306 includes a plurality of pairs of output terminals, e.g., a first pair of output terminals, $V1_a$, $V2_a$, a second pair of output terminals, $V1_b$, $V2_b$, a third pair of output terminals, $V1_c$, $V2_c$, a fourth pair of output terminals, $V1_d$, $V2_d$, a fifth pair of output terminals, $V1_e$, $V2_e$, a sixth pair of output terminals, $V1_f$, $V2_f$, a seventh pair of output terminals, $V1_g$, $V2_g$ and an eighth pair of output terminals, $V1_h$, $V2_h$. As further described hereinafter, the controller assembly 94 generally includes electronics (e.g., switches) to selectively connect each pair of output terminals to the first and second power supply voltages so as to allow each pair of output terminals to selectively supply the first and second power supply voltages therefrom. As described above, the communication port 69a is adapted to be coupled to the power manager 47 via network transmission medium 69b (FIG. 1B).

The first connector assembly 102 includes ports 56a–56h, ports 57a–57h and the input power port 460. As described above, each of ports 56a–56h is coupled to a respective one of ports 57a–57h. The input power port 460 includes a plurality of pairs of input power terminals, e.g., a first pair of input power terminals, $V1_a$, $V2_a$, a second pair of input power terminals, $V1_b$, $V2_b$, a third pair of input power terminals, $V1_c$, $V2_c$, a fourth pair of input power terminals, $V1_d$, $V2_d$, a fifth pair of input power terminals, $V1_e$, $V2_e$, a sixth pair of input power terminals, $V1_f$, $V2_f$, a seventh pair of input power terminals, $V1_g$, $V2_g$ and an eighth pair of input power terminals, $V1_h$, $V2_h$. Each pair of input power terminals of the first connector assembly is connected to a respective pair of output terminals of the controller assembly 94, thereby allowing such pair of input power terminals to receive the first and second power supply voltages selectively supplied therefrom.

For example, according to exemplary embodiments of the present disclosure, the first pair of input power terminals, $V1_a$, $V2_a$, of the connector assembly 102 is connected to the first pair of output terminals $V1_a$, $V2_a$ of the controller assembly 94. The second pair of input power terminals, $V1_b$, $V2_b$, is connected to the second pair of output terminals $V1_b$, $V2_b$. The third pair of input power terminals, $V1_c$, $V2_c$, is connected to the third pair of output terminals $V1_c$, $V2_c$. The fourth pair of input power terminals, $V1_d$, $V2_d$, is connected to the fourth pair of output terminals $V1_d$, $V2_d$. The fifth pair of input power terminals, $V1_e$, $V2_e$, is connected to the fifth pair of output terminals $V1_e$, $V2_e$. The sixth pair of input power terminals, $V1_f$, $V2_f$, is connected to the sixth pair of output terminals $V1_f$, $V2_f$. The seventh pair of input power terminals, $V1_g$, $V2_g$, is connected to the seventh pair of output terminals $V1_g$, $V2_g$. The eighth pair of input power terminals, $V1_h$, $V2_h$, is connected to the eighth pair of output terminals $V1_h$, $V2_h$.

As further described herein, the first connector assembly 102 further includes wiring and/or circuitry to couple each pair of input power terminals to a respective one of the ports 56a–56h. For example, the first pair of input power terminals, $V1_a$, $V2_a$, is coupled to port 56a. The second pair of input power terminals, $V1_b$, $V2_b$, is coupled to port 56b. The third pair of input power terminals, $V1_c$, $V2_c$, is coupled to the port 56c. The fourth pair of input power terminals, $V1_d$, $V2_d$, is coupled to port 56d. The fifth pair of input power terminals, $V1_e$, $V2_e$, is coupled to port 56e. The sixth pair of input power terminals, $V1_f$, $V2_f$ is coupled to port 56f. The seventh pair of input power terminals, $V1_g$, $V2_g$, is coupled to port 56g. The eighth pair of input power terminals, $V1_h$, $V2_h$, is coupled to port 56h.

According to exemplary embodiments of the present disclosure, operation of the electrical configuration of FIG. 8 may be described as follows. The first connector assembly 102 couples data signals between ports 56a–56h and ports 57a–57h. The power supply assembly 92 receives AC power via power cable 502 and generates first, second and third power supply voltages (e.g., 48 VDC, COMMON and 5 VDC) therefrom. The power supply voltages are supplied to the controller assembly 94. In exemplary embodiments, the disclosed controller assembly determines whether power is to be provided to any of the devices connected to ports 56a–56h. The controller assembly may make this determination based on one or more signals (for example, based on signals indicating the amount of current that is received by a device at a particular time and/or with a given voltage stimulus) or any other information provided to or otherwise available to the controller assembly. Thus, the disclosed controller assembly may receive information indicating whether power is to be provided to any of the devices connected to ports 56a–56h. Such information may be in the form of one or more signals or any other suitable form. In alternative exemplary embodiments, one or more methods/techniques set forth in IEEE 802.3af-2003 may be employed to determine power needs of the devices connected to ports 56a–56h (if any). The disclosure of IEEE 802.3af-2003 is hereby incorporated by reference in its entirety.

The controller assembly 94 may also receive commands (e.g., from the power manager 47 via the communication port 69a and network transmission medium 69b) that indicate whether power is to be provided to any devices associated with ports 56a–56h. If power is to be provided, for example, to the remote device 42a connected to port 56a, the controller assembly 94 operatively connects the input terminals, V1, V2, of the controller assembly 94 to the first pair of output terminals, $V1_a$, $V2_a$, of the controller assembly 94, thereby causing the first and second power supply voltages to be supplied to the first pair of input power terminals, $V1_a$, $V2_a$, of the first connector assembly 102. The voltages are coupled to the port 56a and cause power to be supplied to the remote device 42a via a path that includes the network transmission medium 60a, the wall mounted connector 59a and the network transmission medium 58a. If power is instead or in addition to be provided to device 42b connected to port 56b, the controller assembly 94 operatively connects the input terminals, V1, V2, of the controller assembly 94 to the second pair of output terminals, $V1_b$, $V2_b$, of the controller assembly 94, thereby causing the first and second power supply voltages to be supplied to the second pair of input power terminals, $V1_b$, $V2_b$, of the first connector assembly 102. The voltages are coupled to the port 56b and cause power to be supplied to the remote device 42b via a path that includes the network transmission medium 60b, the wall mounted connector 59b and the network transmission medium 58b. If power is instead or in addition to be provided to the device 42c connected to port 56c, the controller assembly 94 operatively connects the input terminals, V1, V2, of the controller assembly 94 to the third pair of output terminals, $V1_c$, $V2_c$, of the controller assembly 94, thereby causing the first and second power supply voltages to be supplied to the third pair of input power terminals, $V1_c$, $V2_c$, of the first connector assembly 102, which couples such voltages to the port 56c and causes power to be supplied to the device 42c via a path that includes the network transmission medium 60c, wall mounted connector 59c and the network transmission medium 58c. According to exemplary embodiments of the present disclosure, the same modes of operation apply for power supply to the remaining ports 56d–56h and the associated remote devices.

Figure 9A:
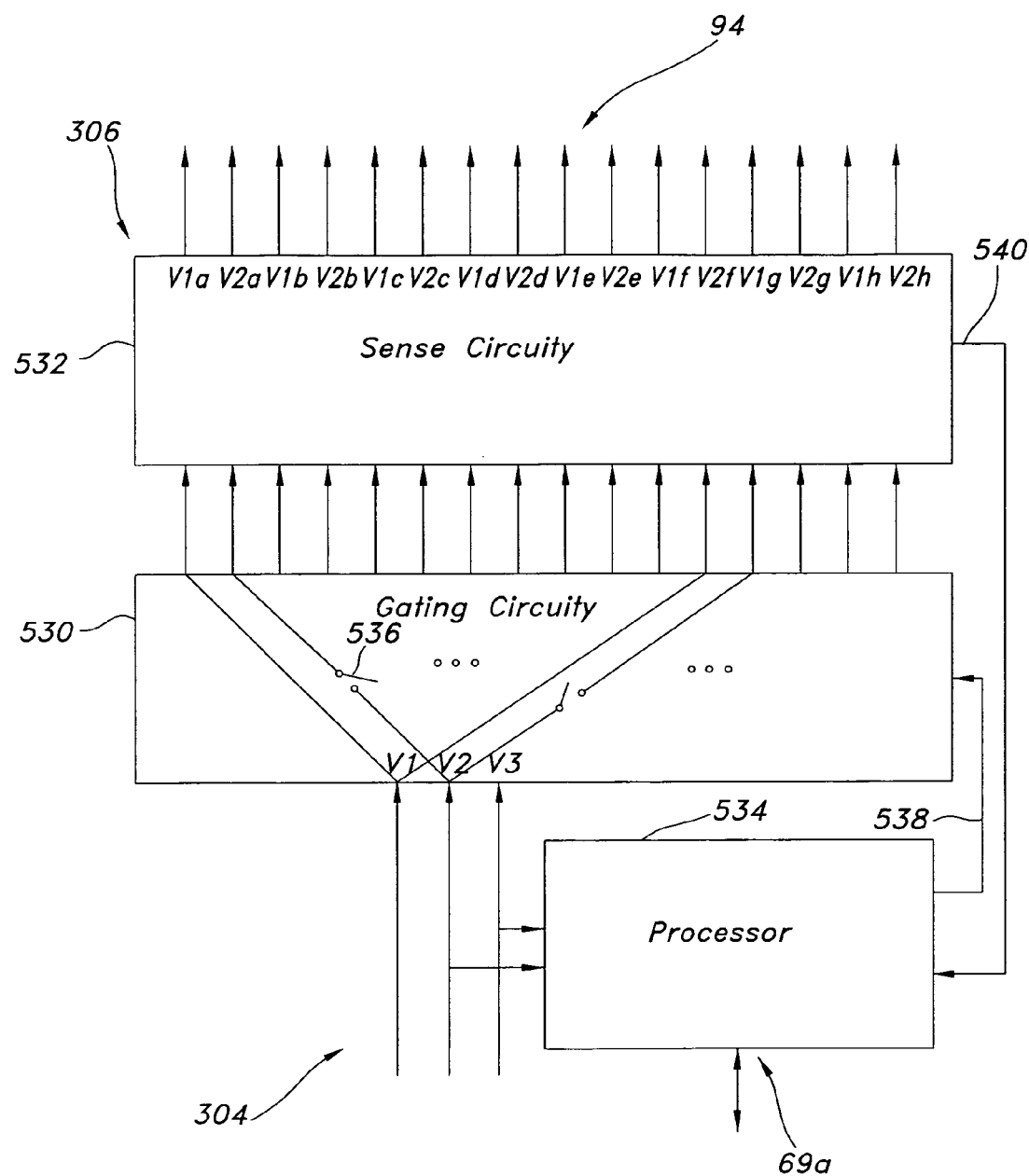
FIGS. 9A and 9B are block diagram representations of an electrical configuration used in one embodiment of the controller assembly of FIG. 2.

FIG. 9A is a block diagram representation of an exemplary electrical configuration used in an embodiment of the disclosed controller assembly 94. In this exemplary embodiment, the controller assembly 94 includes gating circuitry 530, sense circuitry 532 and an associated processor 534. The gating circuitry 530 includes switches (e.g., switch 536)

that open/close in response to control signals on lines 538 from the processor 534. Closing a switch (e.g., switch 536) operatively connects the input terminal V2, of the controller assembly 94 to a respective one of the output terminals, e.g., $V2_a$. On the other hand, opening such switch disconnects the input terminal from the respective output terminal. Input terminal V1 is always connected to output terminals $V1_a$–$V1_h$. The sense circuitry 532 monitors the amount of current that each remote device receives via the gating circuitry 530 and supplies signals indicative thereof on lines 540. The processor 534 uses the signals from the sense circuitry 532 to determine whether each remote device can handle and/or continue to handle continuous power. Based on such determination, the processor issues control signals to the appropriate switch or switches.

Figure 9B:
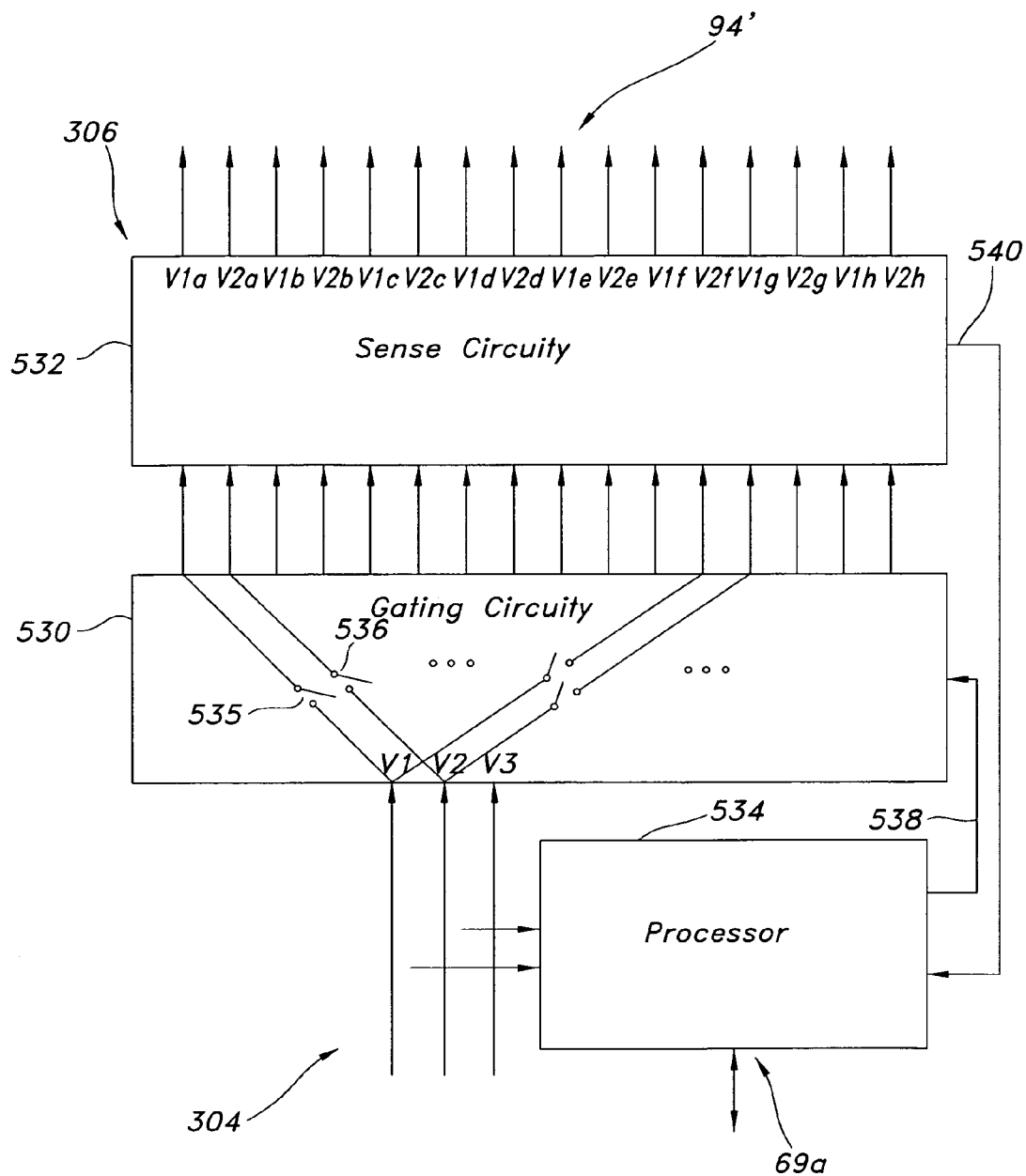

FIG. 9B is a block diagram representation of an alternative controller assembly according to the present disclosure. The alternative controller assembly 94' includes gating circuitry 530', sense circuitry 532 and a processor 534 that are similar to the gating circuitry 530, sense circuitry 532 and processor 534 of the controller assembly 94 of FIG. 9A. However, in the alternative embodiment of FIG. 9B, the gating circuitry 530' includes pairs of switches (e.g., switches 535, 536) that open/close in response to control signals on lines 538 from the processor 534. Closing a pair of the switches (e.g., switches 535, 536) operatively connects the input terminals, V1, V2, of the controller assembly 94' to a respective pair of the output terminals, e.g., $V1_a$, $V2_a$. On the other hand, opening such pair of switches disconnects the input terminals from the respective pair of output terminals. The sense circuitry 532 monitors the amount of current that each remote device receives via the gating circuitry 530' and supplies signals indicative thereof to processor 534 on line 540. The processor 534 uses the signals from the sense circuitry 532 to determine whether each remote device can handle and/or continue to handle continuous power, thereby generating appropriate control signals to the gating circuitry 530'.

Figure 10:
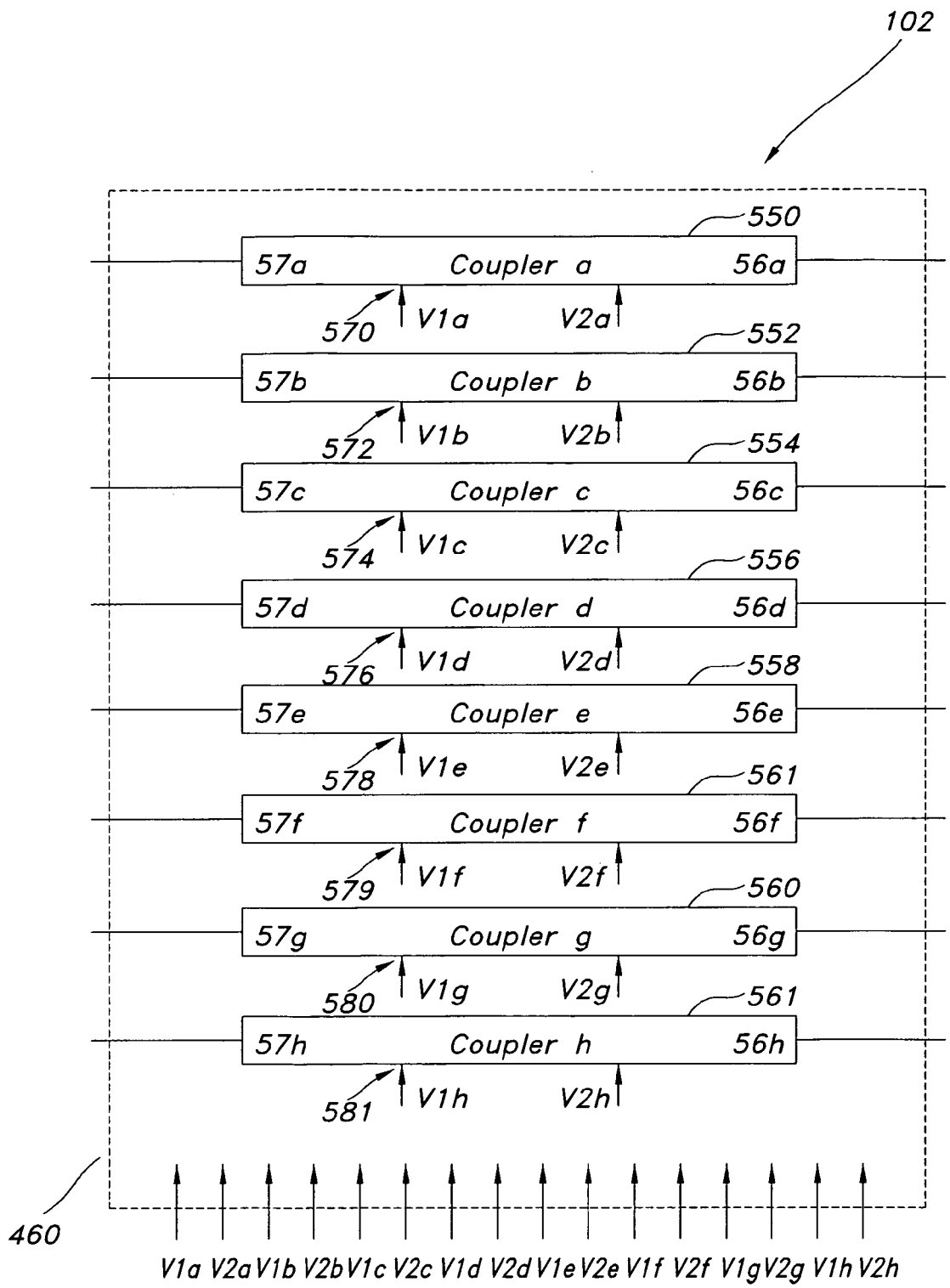
FIG. 10 is a block diagram representation of an electrical configuration used in one embodiment of the first connector assembly of FIG. 2.

FIG. 10 is a block diagram representation of electrical circuitry associated with an exemplary embodiment of a first connector assembly 102 of the present disclosure. In the disclosed embodiment, the first connector assembly 102 includes eight identical coupler circuit portions, or couplers, including coupler 550 ("coupler a"), coupler 552 ("coupler b"), coupler 554 ("coupler c"), coupler 556 ("coupler d"), coupler 558 ("coupler e"), coupler 559 ("coupler f"), coupler 560 ("coupler g"), and coupler 561 ("coupler h"). Coupler 550 communicates with port 56a, port 57a and an input power port 570 that is connected to the pair of input power terminals V1a, V2a. Coupler 552 communicates with port 56b, port 57b and an input power port 572 that is connected to the pair of input power terminals $V1_b$, V2b. Coupler 554 communicates with port 56c, port 57c and an input power port 574 that is connected to the pair of input power terminals V1c, V2c. Coupler 556 communicates with port 56d, port 57d and an input power port 576 that is connected to the pair of input power terminals V1d, V2d. Coupler 558 communicates with port 56e, port 57e and an input power port 578 that is connected to the pair of input power terminals V1e, V2e. Coupler 559 communicates with port 56f, port 57f and an input power port 579 that is connected to the pair of input power terminals V1f, V2f. Coupler 560 communicates with port 56g, port 57g and an input power port 580 that is connected to the pair of input power terminals V1g, V2g. Finally, coupler 561 communicates with port 56h, port 57h and an input power port 581 that is connected to the pair of input power terminals V1h, V2h.

Figure 11:
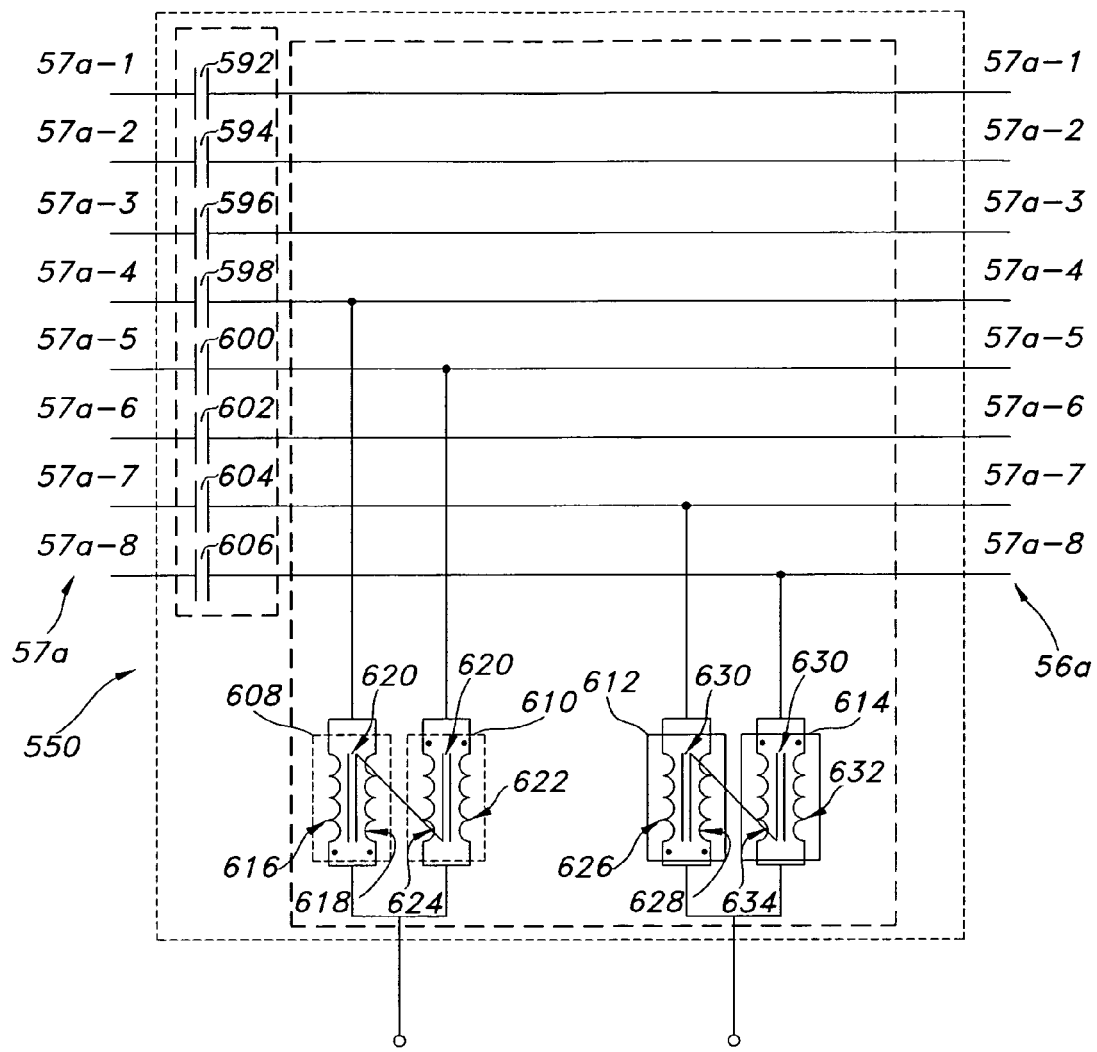
FIG. 11 is a schematic diagram of an electrical configuration used in one embodiment of the coupler of FIG. 10.

FIG. 11 is a schematic diagram of an exemplary embodiment of coupler 550, in accordance with an aspect of the present disclosure. In this exemplary embodiment, port 56a and port 57a typically take the form of Ethernet ports, each port having eight (8) contacts. In FIG. 11, the first through eighth contacts of port 56a are labeled 56a-1, 56a-2, 56a-3, 56a-4, 56a-5, 56a-6, 56a-7 and 56a-8, respectively. Similarly, the first through eighth contacts of port 57a are labeled 57a-1, 57a-2, 57a-3, 57a-4, 57a-5, 57a-6, 57a-7 and 57a-8, respectively. The first and second contacts of port 56a are adapted to be coupled to a first pair of networking data wires in a network transmission medium. The third and sixth contacts of port 56a are adapted to be coupled to a second pair of networking data wires of such network transmission medium. The fourth and fifth contacts of port 56a are adapted to be coupled to a third pair of networking data wires of the network transmission medium. The seventh and eight contacts of port 56a are adapted to be coupled to a fourth pair of networking data wires of the network transmission medium.

In this exemplary embodiment of coupler 550, a DC power coupling portion and a DC current blocking portion are provided. The DC current blocking portion includes capacitors 592, 594, 596, 598, 600, 602, 604, 606. The DC power coupling portion includes common mode chokes 608, 610, 612, 614. For purposes of current blocking, the first contact of port 56a is coupled to a first terminal of capacitor 592, and a second terminal of capacitor 592 is coupled to the first contact of port 57a. The second contact of port 56a is coupled to a first terminal of capacitor 594, and a second terminal of capacitor 594 is coupled to the second contact of port 57a. Similarly, third through eighth contacts of port 56a are coupled to a first terminal of a respective one of capacitors 596, 598, 600, 602, 604, 606, and a second terminal of each of capacitors 596, 598, 600, 602, 604, 606 is coupled to a respective one of third through eighth contacts of port 57a.

For purposes of power coupling, first and second terminals of a common mode choke 608 are coupled to the fourth contact (56a-4) of port 56a. Third and fourth terminals of the common mode choke 608 are coupled to the input power terminal V1a. The input power terminal V1a is also coupled to first and second terminals of a common mode choke 610, and the third and fourth terminals of common mode choke 610 are coupled to the fifth contact (56a-5) of port 56a.

Turning to the wiring of common mode choke 612, first and second terminals of common mode choke 612 are coupled to the seventh contact (56a-7) of port 56a. Third and fourth terminals of common mode choke 612 are coupled to the input power terminal V2a. The input power terminal V2a is also coupled to first and second terminals of common mode choke 614, while the third and fourth terminals of common mode choke 614 are coupled to the eighth contact (56a-8) of port 56a.

Common mode choke 608 has first and second windings 616, 618 that are wound around a core 620. The first winding 616 is coupled between the first and fourth terminals of common mode choke 608. The second winding 618 is coupled between the second and third terminals of common mode choke 608. Common mode choke 610 has first and second windings 622, 624 which are also wound around the core 620 (i.e., the same core as that around which the windings 616, 618 of common mode choke 608 are wound).

Figure 12A:
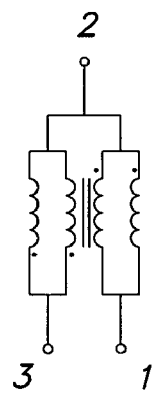
FIGS. 12 and 12A show an exemplary common mode choke that may be incorporated into an electrical configuration, e.g., the electrical configuration of FIG. 11, according to an embodiment of the present disclosure.
Figure 12:
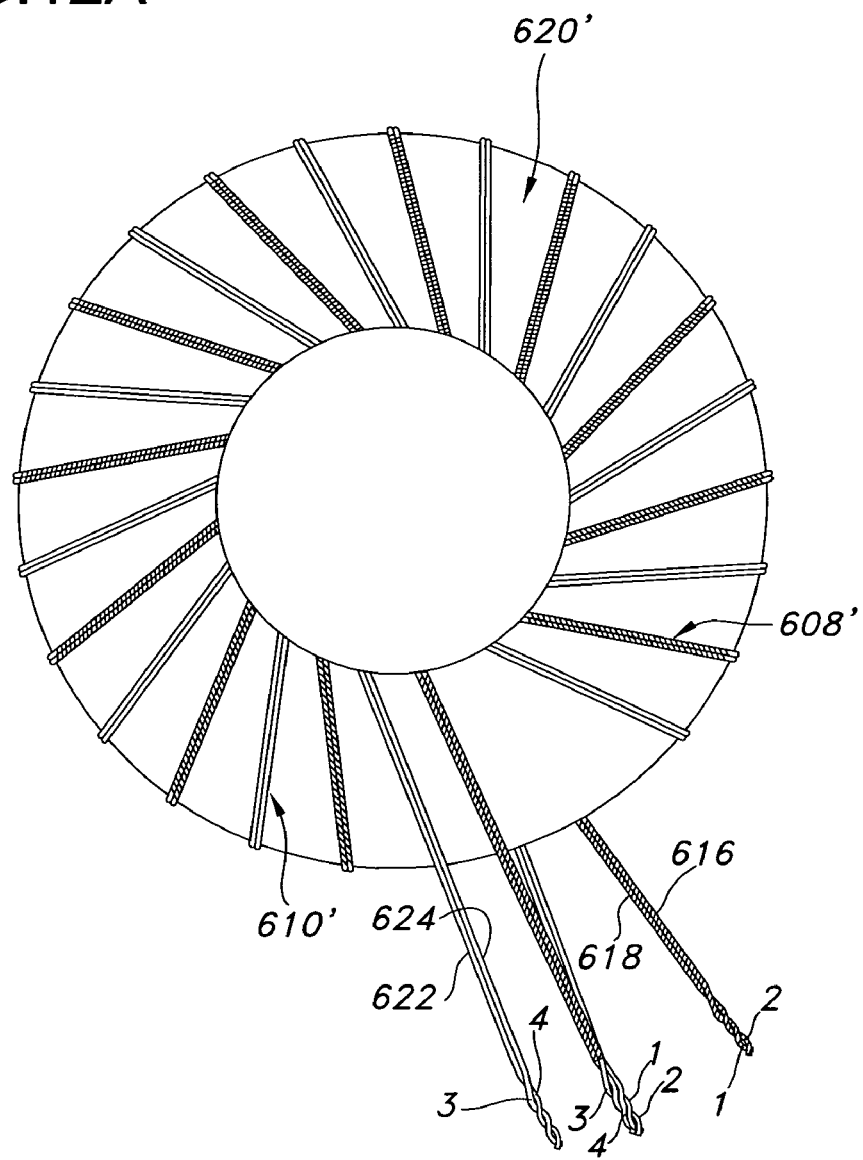
Figure 16:
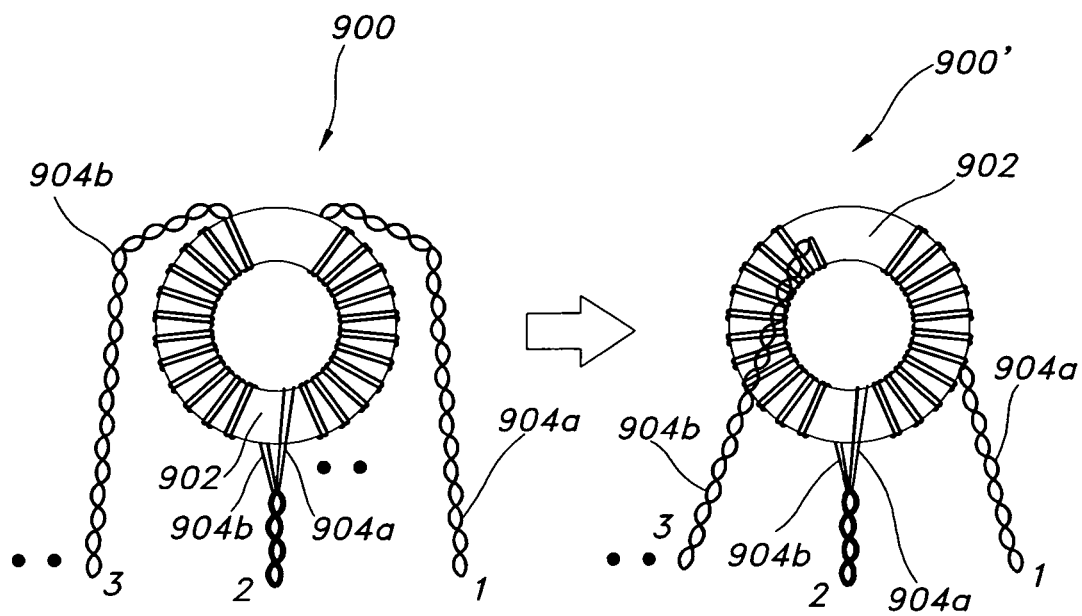
FIG. 16 shows further exemplary embodiments of a common mode choke that may be incorporated into an electrical configuration, e.g., the electrical configuration of FIG. 11, according to an embodiment of the present disclosure.
Figure 17:
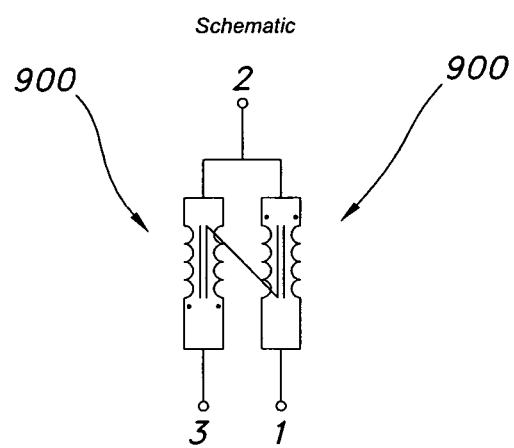
FIG. 17 is a schematic view of the exemplary common mode choke of FIG. 16.
Figure 18A:
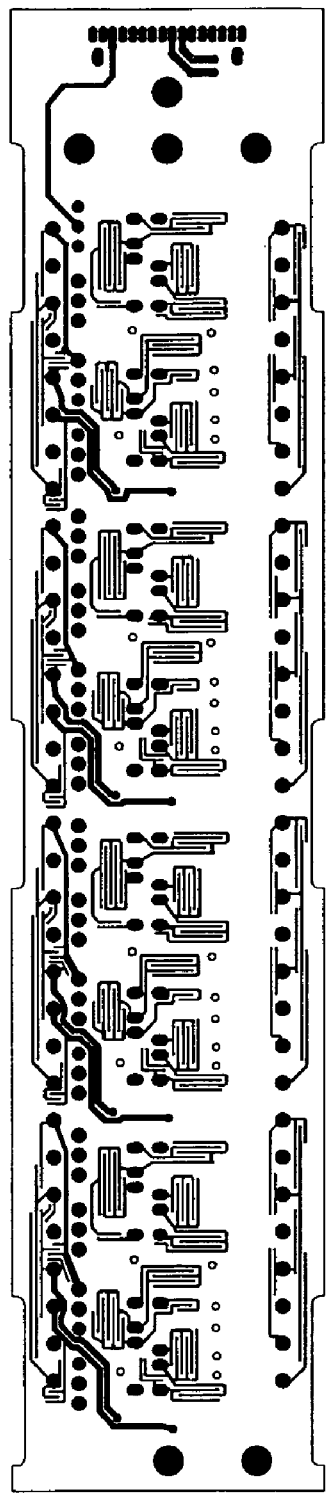
FIGS. 18A and 18B are front elevation views of a first and second layer of a printed circuit board used in an insert portion of the present disclosure.
Figure 18B:
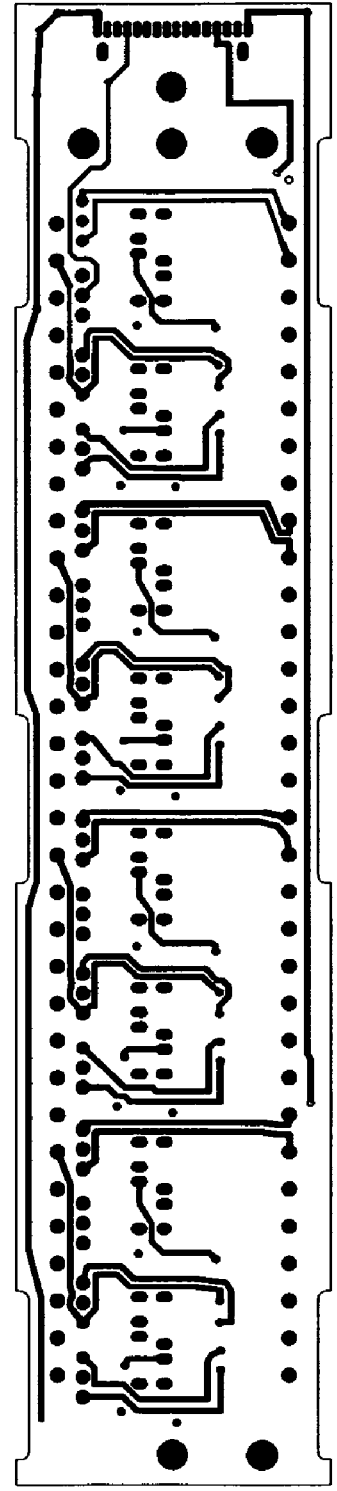
Figure 19A:
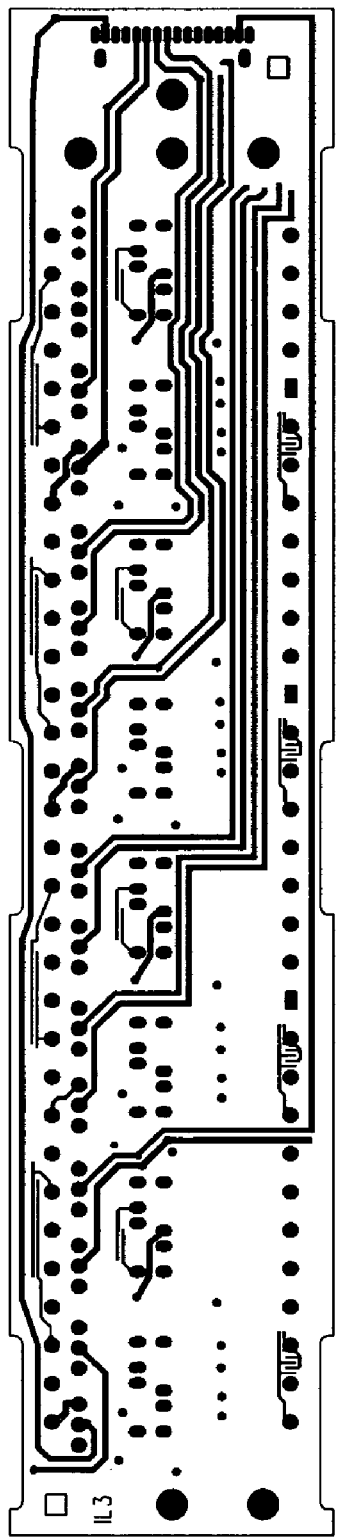
FIGS. 19A and 19B are front elevation views of a third and fourth layer of a printed circuit board used in an insert portion of the present disclosure.
Figure 19B:
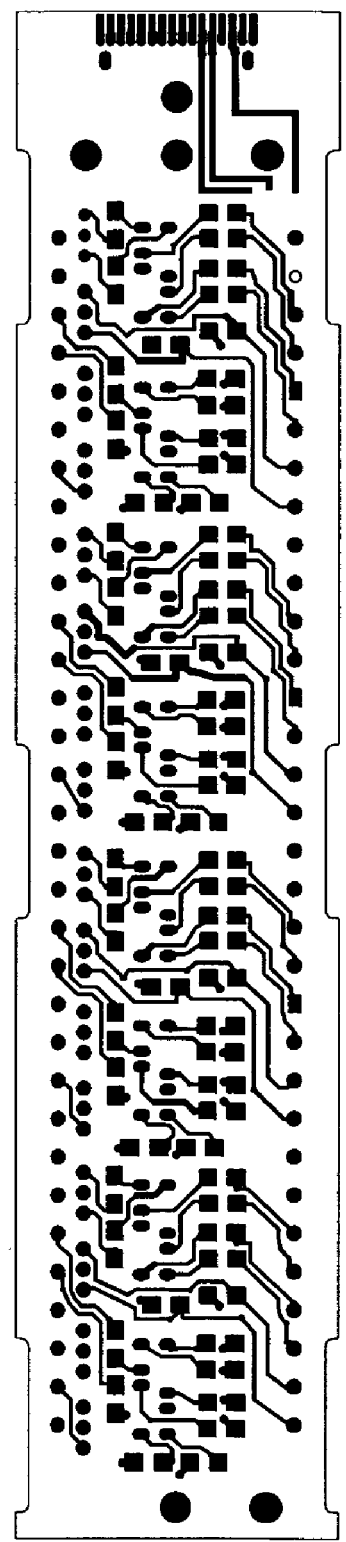

Similarly, common mode choke 612 has first and second windings 626, 628 that are wound around a core 630. Common mode choke 614 has first and second windings 630, 632 that are also wound around the core 630 (i.e., the same core as that around which the windings 626, 628 of common mode choke 612 are wound). Further schematic views of common mode chokes corresponding in design/operation to common mode chokes 608, 610, 612, 614 are provided in FIGS. 16 and 17. An alternative common mode choke design is set forth in FIGS. 12 and 12A. Of note, the common mode choke design of FIGS. 16 and 17 is laid out such that both input wires are wrapped around a core with physical wire separation, whereas the common mode choke design of FIGS. 12 and 12A is laid out such that both input wires are wrapped around a core with no physical wire separation. In both common mode choke designs, the input wires are wrapped in opposite directions for flux cancellation. However, in the design of FIGS. 16 and 17, the wires are wrapped on opposite sides of the core, as contrasted with the parallelism/adjacency of the wrapped wires in the design of FIGS. 12 and 12A. In contrasting the performance of the respective common mode choke designs, it is noted that the design of FIGS. 16 and 17 provides increased/improved differential and common mode impedance relative to the design of FIGS. 12 and 12A. Accordingly, the design of FIGS. 16 and 17 is schematically incorporated into the exemplary electrical configuration of FIG. 11, although the present disclosure is not limited to the advantageous common mode choke design of FIGS. 16 and 17.

The operation of the DC power coupling and DC current blocking functionalities of the exemplary coupler configuration of FIG. 11 may be described as follows. Data signals from ports 56a and/or 57a generally pass through capacitors 592, 594, 596, 598, 600, 602, 604, 606 with minimal loss, thereby enhancing system performance with respect to insertion loss and return loss, consistent with applicable performance standards, and advantageously minimizing DC currents between the coupler circuit portion 550 (FIG. 10) and the hub 46 (FIG. 1B). One pair of networking data wires (e.g., wire 4 and wire 5) in the depicted coupling configuration is used to deliver power supply current to a network device, and another pair of networking data wires (e.g., wire 7 and wire 8) is used to receive return current from the network device.

Common mode chokes 608, 610 couple the power supply current onto one of the pairs of networking data wires (e.g., wire 4 and wire 5). The windings of each of these common mode chokes have a DC resistance close to zero ohms (e.g., 0.5 ohms) and, thus, the impedance between a contact input power port and the pair of networking data wires is close to zero ohms at DC. However, the magnitude of this impedance at high frequency is significantly higher, thereby helping block enough of the data signal to meet applicable performance requirements. The coupled power supply current is split approximately equally between the two wires of the pair of networking data wires. The approximately equal current flow creates an approximately equal and opposite DC flux within the core 620, thereby helping to prevent saturation of the core 620. Common mode chokes 612, 614 receive the return current from the other pair of networking data wires (e.g., wire 7 and wire 8). The return current is split approximately equally between the two wires of the pair of networking data wires. This approximately equal current flow creates an approximately equal and opposite DC flux within the core 630, thereby helping to prevent saturation of the core 630.

As noted above, FIGS. 12 and 12A schematically depict an exemplary embodiment of a common mode choke according to the present disclosure. The exemplary common mode chokes of FIG. 12 are designated as common mode chokes 608' and 610', which are wrapped around core 620'. For the convenience of the reader, the first and second windings of the common mode choke 608' are shown with cross hatched insulation. In this embodiment, the first and second windings 616, 618 of the common mode choke 608' are wound adjacent one another (i.e., bifilar). The first and second windings 622, 624 of the common mode choke 610' are also wound adjacent one another (i.e., bifilar). The first and second terminals of the common mode choke 610' are connected to the third and fourth terminals of the common mode choke 608', as shown. The third and fourth terminals of the common mode choke 610' are connected to one another, as shown. The first and second terminals of the common mode choke 608' are also connected to one another, as shown. Thus, the exemplary common mode chokes of FIGS. 12 and 12A are fabricated such that both input wires are wrapped around a core with no physical wire separation. Although the input wires are wrapped in opposite directions for flux cancellation, the parallelism and adjacency of the wires generally increases signal coupling. Accordingly, as compared to the common mode choke design of FIGS. 16 and 17, the schematically depicted common mode choke design of FIGS. 12 and 12A provide less differential and common mode impedance.

In the exemplary embodiment schematically illustrated in FIGS. 12 and 12A, each winding is shown having twelve turns. In alternative exemplary embodiments of the present disclosure, each winding has ten turns and the core has a permeability of about 2k. In further exemplary embodiments of the present disclosure, each winding has eighteen turns and the core has a permeability of about 5k. According to exemplary embodiments of the present disclosure, common mode chokes that are commercially available from CoEv, Inc. (Menlo Park, Calif.), e.g., a common choke available as part number C9485L.

According to an alternative embodiment of the present disclosure, a high quality factor (commonly denoted "Q") may be obtained or achieved. A higher "Q" factor translates to performance that more closely approximates a "pure" inductor which, in turn, makes it easier to increase a choke's impedance and/or resistance over a broader frequency band. A high-Q inductor is better than a low-Q inductor for broadband AC suppression. As is known in the art, the quality factor of a component is computed using the formula $Q=X_L/R$, where $X_L$ is the magnitude of the inductance and R is the magnitude of the inductive resistance.

Figure 13:
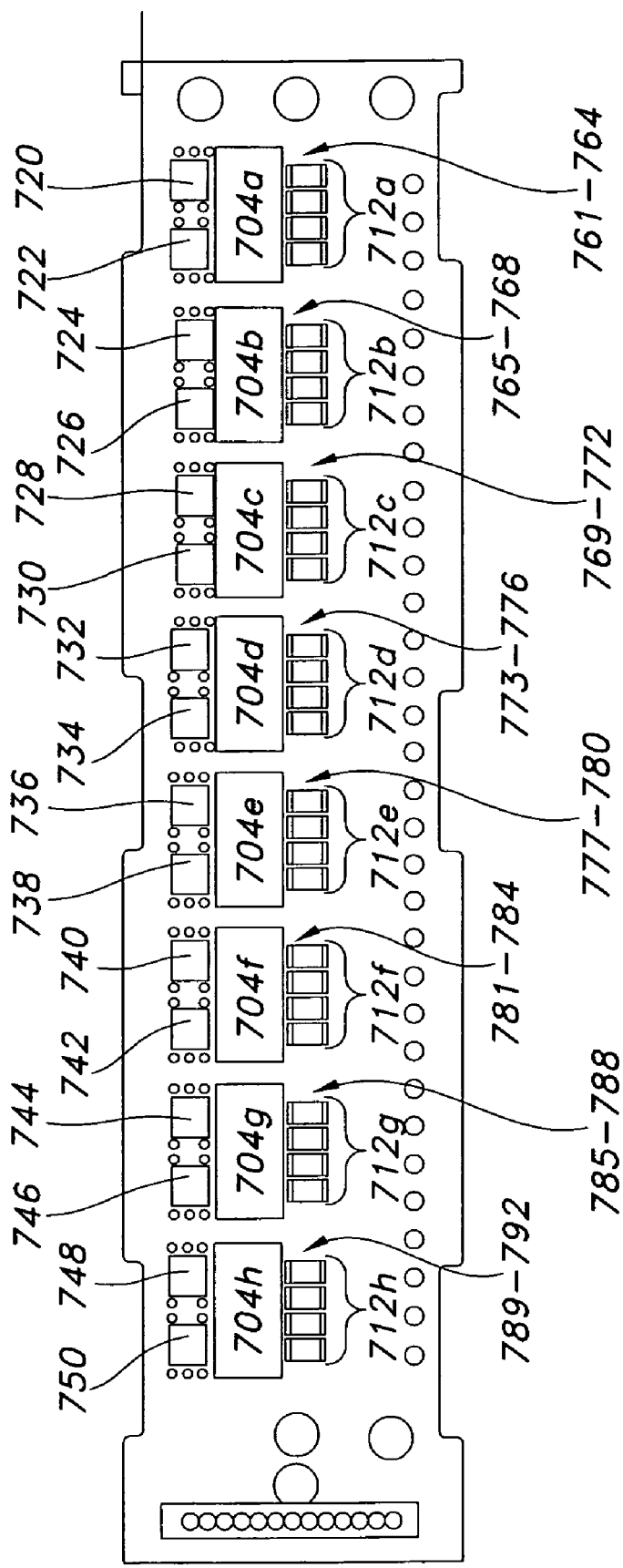
FIG. 13 is a front elevational view of an insert portion of the connector module of FIGS. 6–7.
Figure 14A:
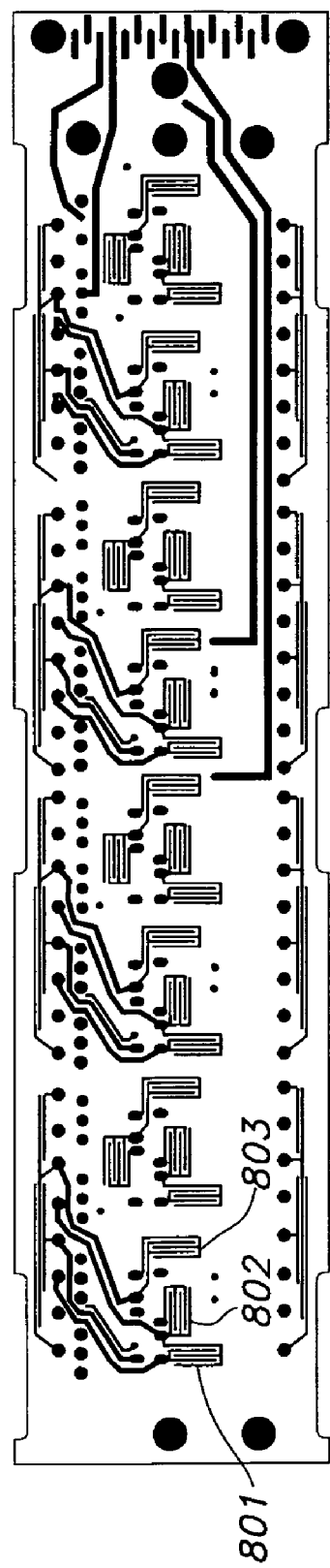
FIG. 14A is a front elevational view of a first layer of a printed circuit board used in the insert portion of FIG. 13.
Figure 14B:
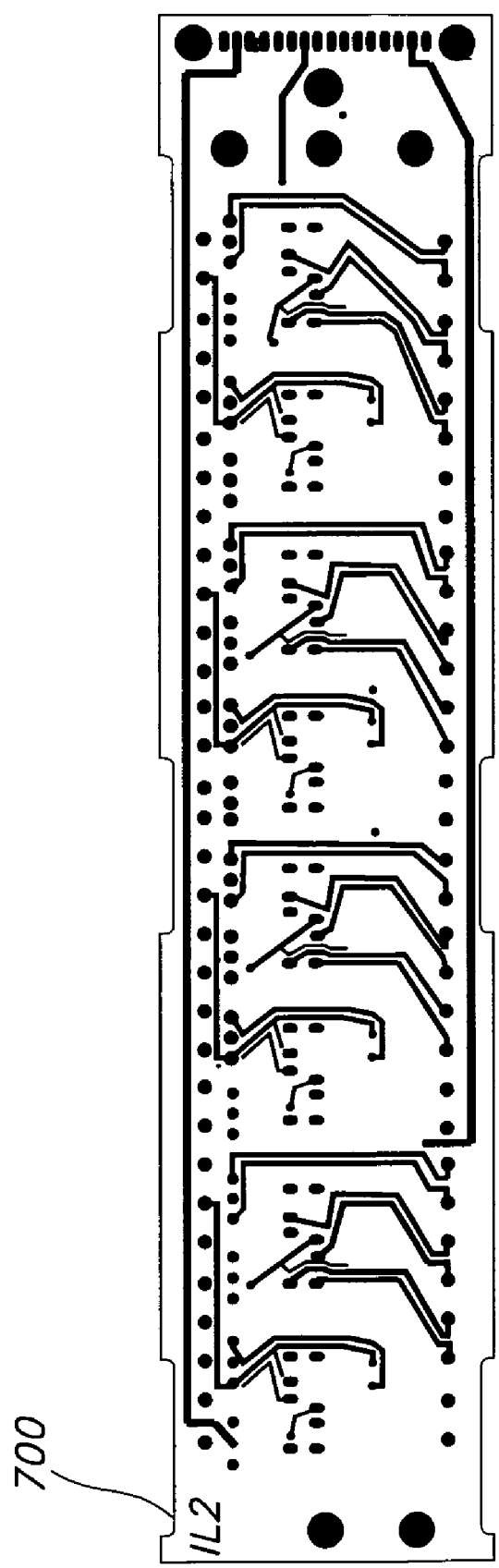
FIG. 14B is a front elevational view of a second layer of a printed circuit board used in the insert portion of FIG. 13.
Figure 14C:
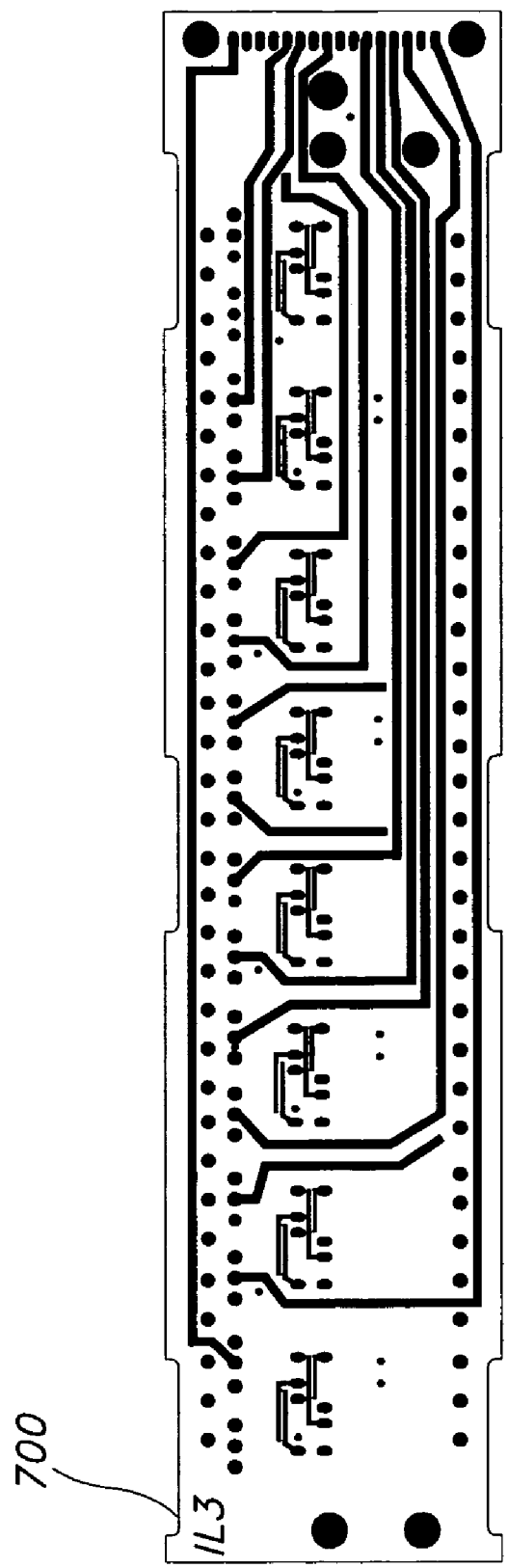
FIG. 14C is a front elevational view of a third layer of a printed circuit board used in the insert portion of FIG. 13.
Figure 14D:
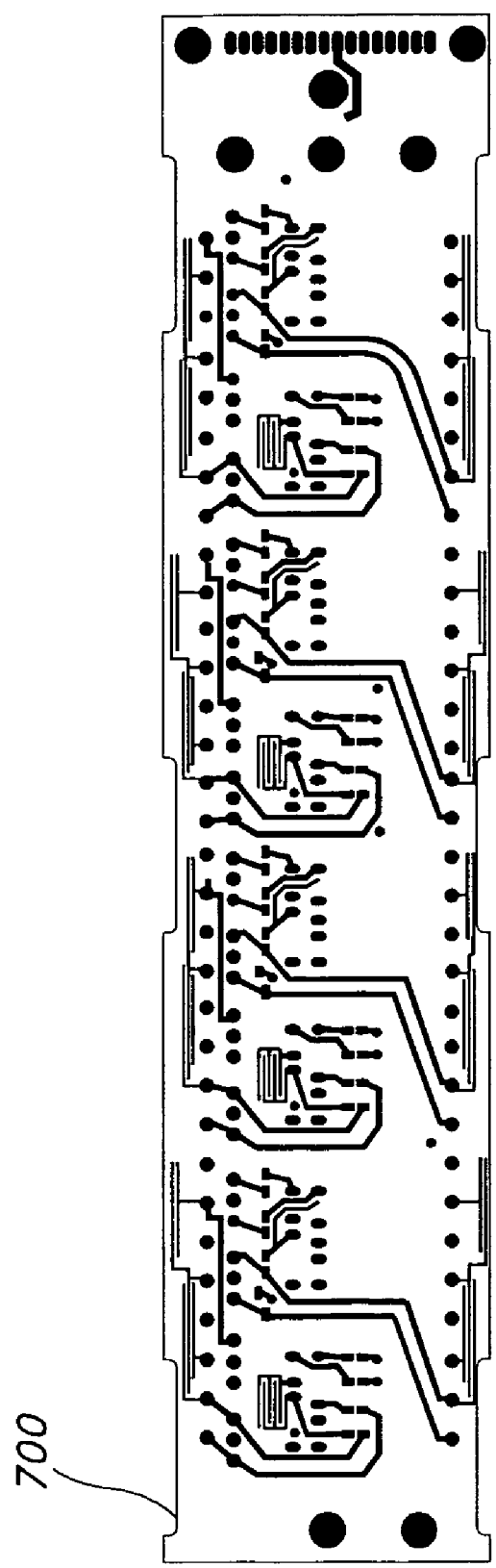
FIG. 14D is a front elevational view of a fourth layer of a printed circuit board used in the insert portion of FIG. 13.

FIG. 13 shows a front elevational view of an exemplary printed circuit board 700 with a plurality of coupler circuits 712a–712h disposed thereon. As described with reference to FIG. 7, each coupler circuit 712a–712h may be fabricated in accordance with coupler circuit 550. Each coupler circuit typically includes two common mode choke assemblies, e.g., common mode choke assemblies 720–722 and eight capacitors. Four of the capacitors comprise discrete capacitors, e.g., discrete capacitors 761–764, mounted to the printed circuit board 700. FIGS. 14A–14D show conductive layers of the printed circuit board 700. FIG. 14A shows a first conductive layer, which is disposed on a major outer surface of the first dielectric layer. FIG. 14B shows a second conductive layer, which is disposed between the first dielectric layer and the second dielectric layer. FIG. 14C shows a third conductive layer, which is disposed between the second dielectric layer and the third dielectric layer. FIG. 14D shows a fourth conductive layer, which is disposed on a major outer surface of the third dielectric layer.

Figures 15A, 15B:
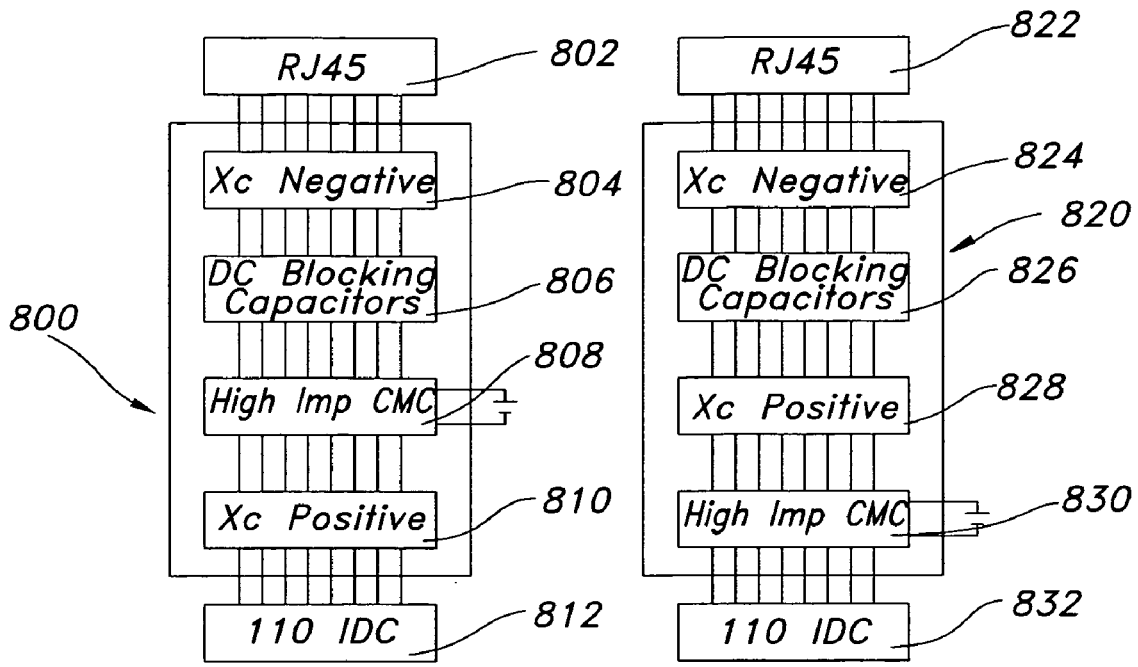
FIGS. 15A–15E are block diagrams of various electrical configurations according to the present disclosure.
Figures 15C, 15D, 15E:
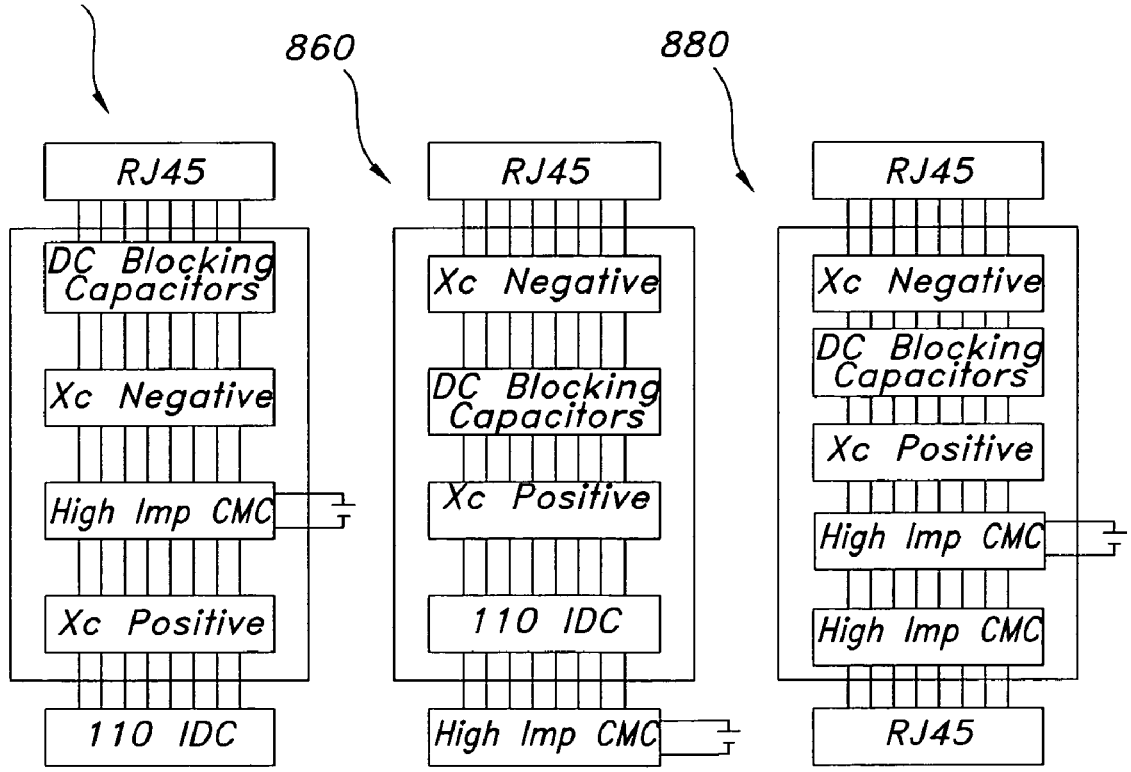

With reference to the schematic block diagram of FIG. 15A, coupling system 800 includes an RJ45 port (802), a negative coupling portion Xc– (804), a DC current blocking portion (806), a DC power coupling portion (808), a positive coupling portion Xc+ (810) and an insulation displacement contact (IDC) portion (812). With further reference to FIG. 15A, the DC power coupling portion 808 is referenced as a "high impedance common mode choke (CMC)" stage. The RJ45 port (802) facilitates electrical mating of a plug with the disclosed coupling system, and the IDC portion 812 allows for efficient electrical mating of a 4-pair UTP cable to the disclosed system. For purposes of the present discussion, the designation of input and output are for DC power direction only. According to the disclosed system, the DC current blocking portion 806 takes the form of blocking capacitors that function to limit DC Power such that the DC power flows only through the PCB at the IDC (output) location of system 800.

With reference to the schematic block diagrams of FIGS. 15B–15E, alternative system layouts are set forth which offer similarly advantageous results to the design of FIG. 15A. Indeed, the block diagrams of FIGS. 15B–15E provide alternative schematic layouts of coupling systems according to the present disclosure. Thus, for example, FIG. 15B provides a coupling system 820 that includes an RJ45 port (822), a negative coupling portion Xc− (824), a DC current blocking portion (826), a positive coupling portion Xc+ (828), a DC power coupling portion (830) and an insulation displacement contact (IDC) portion (832). As with coupling system 800 of FIG. 15A, the DC power coupling portion 830 of coupling system 820 is referenced as a "high impedance common mode choke (CMC)" stage. The RJ45 port (822) of coupling system 820 facilitates electrical mating of a plug with the disclosed coupling system, and the IDC portion 832 allows for efficient electrical mating of a 4-pair UTP cable. The designation of input and output are for DC power direction only, and the DC current blocking portion 826 takes the form of blocking capacitors that function to limit DC Power such that the DC power flows only through the PCB at the IDC (output) location of system 820. The sequence of operative components/functions are further varied in alternative coupling systems 840, 860, 880 of FIGS. 15C–15E. However, the overall functionalities and advantages associated with each disclosed coupling system is substantially unchanged.

The sections of the disclosed coupling circuits are electrically balanced, particularly with respect to NEXT effects, so as to provide advantageous low noise/low crosstalk connecting hardware device/system. The connector balance between NEXT and impedance is enhanced so as to reduce Return Loss. According to exemplary embodiments of the disclosed coupling circuitry, advantageous NEXT balance is achieved by controlling signal path impedances of the DC coupling circuitry and the Xc+ and Xc− coupling sections. The DC coupling circuitry has a nominal impedance $Z^{DCC}$ over frequency of 1200 ohms. The signal paths that contain Xc+ and Xc− circuitry have a nominal impedance over frequency that has been increased to 110 ohms. Of note, an equivalent schematic for the insertion of the DC coupling circuitry to signal path is a parallel resistive network. By increasing the nominal trace impedance ($Z^{Tr}$) 110 ohms— which is a combination of the Xc+ and X−c coupling sections and trace design—the resistive summation translates to: $Zout = 1/((1/Z^{Tr}) + (1/Z^{DCC}))$; where $Z^{Tr}$ is the nominal trace impedance and $Z^{DCC}$ is the nominal DC circuitry impedance. The combined trace impedance output of the three circuits becomes essentially 100 ohms. Thus, according to exemplary embodiments of the present disclosure, line impedances may be designed/selected through circuit traces (i.e., signal paths) that utilize/provide Xc+ and Xc−.

Indeed, for operation of EIA category 5e and 6 rated cabling, an ideal impedance for signal transmissions is on the order of 100 ohms.

As described in commonly assigned U.S. Pat. No. 6,533,618 to Aekins ("Bi-Directional Balance Low Noise Communication Interface;" the entire contents of U.S. Pat. No. 6,533,618 to Aekins being incorporated herein by reference), crosstalk reduction may be advantageously obtained by utilizing a connector that includes a low reactance dielectric insert that is electrically connected to a printed circuit board (PCB) that consists of third, fourth, fifth and sixth RJ45 input terminals arranged in an ordered array. As further described in the Aekins '618 patent, the third and fifth terminals as well as the fourth and sixth terminals may be positively compensated, and the fifth and sixth terminals, as well as the third and fourth terminals, may be negatively compensated, all for the propose of electrically coupling each of the input terminals to the respective output terminals. By arranging the terminals in such a manner, canceling of induced crosstalk across the adjacent connector terminals is achieved.

According to the teachings of the Aekins '618 patent, the negative circuit includes third, fourth, fifth and sixth conductive paths between the respective input and output terminals. Each conductive path includes a plurality of conductive strips arranged with capacitive tuning stubs connected on one end of the input plug terminals to provide coupling between each conductive path. The capacitive tuning stubs associated with the third and fifth conductive paths are in relatively close proximity with each other to simulate capacitive coupling and generally contain twice the coupling energy as the fourth and sixth conductive paths capacitive tuning stubs. The capacitive tuning stubs associated with the fourth and sixth conductive paths are in relatively close proximity with each other to simulate antenna transmission and receiving.

A reverse circuit means is also generally provided according to the Aekins '618 patent that includes third, fourth, fifth and sixth conductive paths between the respective input and output terminals. Each conductive path includes a plurality of conductive strips arranged with capacitive tuning stubs connected on one end of the input plug terminals to provide coupling between each conductive path. The capacitive tuning stubs associated with the third and fourth conductive paths are in relatively close proximity with each other to simulate capacitive coupling stubs, and the capacitive tuning stubs associated with the fifth and sixth conductive paths are in relatively close proximity with each other to simulate capacitive coupling stubs.

At time equal to one (T=1), the forward method of the Aekins '618 patent involves inducing an opposite signal, i.e., negative incident energy ("−IE 1"), from the incident transmission line to an adjacent victim transmission line whose positive noise ("+VE1"), or positive victim energy, originated from the positive signal of the incident transmission line. The forward method also involves inducing an opposite signal, i.e., a positive incident energy ("+IE1"), from the incident transmission line to an adjacent victim transmission line whose negative noise ("−VE1"), or negative victim energy, originated from the negative signal of the incident transmission line. At time equal to one (T=1), the method further involves inducing an opposite signal, i.e., negative incident energy ("−VE1"), from the incident transmission line to an adjacent victim transmission line whose negative noise ("−VE1"), or negative victim energy, originated from the negative signal of the incident transmission line.

When combined, the forward and reverse sections of the Aekins '618 patent together produce a balanced signal energy output of the coupled victim line. The forward section provides enough signal energy to allow for half of its energy to be forward compensated and the other half is left over for the reverse section. The reverse section takes the forward signal energy and allows that signal energy to be coupled into the victim lines similar coupled energy polarity. The end result is a balanced output of the victim's noise energy that are canceled by each other due to their opposite coupling effects. The victim's signal energy that was induced by the incidents positive and negative signal energy is canceled by utilizing its self coupling of its opposing signal energies.

According to exemplary embodiments of the present disclosure, the DC coupling circuitry is electrically shunted to trace the path of the second, third and seventh, eighth conductive paths between the respective input and output terminals. Each DC coupling circuitry is advantageously impedance balanced to the Xc+ and Xc− that are applied to the selective signal paths, i.e., the first, second, third, fourth, fifth, sixth, seventh and/or eighth signal paths. In addition, according to exemplary embodiments of the present disclosure, the DC blocking capacitors are electrically connected in series to all eight trace paths. The DC blocking capacitors thus allow AC and data signals to pass through from input terminal to output terminals, while preventing/blocking DC voltage passage to the input RJ45 terminals.

With reference to FIGS. 16 and 17 and as previously described, an exemplary common mode choke design is schematically depicted according to the present disclosure. As shown therein, an exemplary wideband, high impedance DC coupling circuitry of the present disclosure includes common mode chokes 900, 900' that feature a toroidal-style core 902 fabricated from a Ferrite material. A toroidal shape is generally preferred for the core due to the higher inductance allowed by having no inherent air gap at a mating surface. Elimination of such potential air gaps adds as much as 35% more impedance at lower frequencies. The toroidal core material is typically a doughnut shaped device of very low flux leakage when the wires are wound around it in an advantageous formation, as described herein. According to exemplary embodiments of the present disclosure, the wound wires are enamel insulated copper wires.

To electrically shunt the DC coupling device upon a differential line, a desired wire formation according to the present disclosure involves reversing the wire wound direction of the (dual) two input wire lines 904a, 904b around the toroidal core 902. The signals that enter from the two input lines 904a, 904b are reduced by the reversing flux that is created from the differential signal, positive and negative signal transmission. The two input lines 904a, 904b also are on opposite sides of the toroidal core 902. This arrangement further reduces the differential lines coupling and increases the DC coupling device's line 1 to line 2 impedance.

According to exemplary embodiments of the present disclosure, two wires per input line are utilized—for each wire input. By utilizing two wires for each input line, the disclosed system advantageously permits the disclosed coupling device to carry more current per line. By increasing the current per line, the disclosed system facilitates the use of smaller wire sizes, thereby maximizing and improving the core-to-turn ratio of the disclosed common mode chokes. In addition, the disclosed DC coupling design of the present disclosure offers enhanced DC resistance (DCR) performance. According to exemplary embodiments of the present disclosure, the DCR performance is reduced by a factor of two, and the DCR balance between lines is substantially improved.

In fabricating a common mode choke 900, 900', each wire of the input lines 904a, 904b is twisted upon entering the toroidal core 902. By twisting the input lines, external capacitance that can occur as system frequencies increase is minimized. If external capacitance is not addressed, the impedance of the differential transmission lines may be changed. The input lines 904a, 904b are not twisted when wound around the toroidal core 902, which further minimizes the external capacitance that can alter the impedance of the differential transmission lines. After a desired number of turns are wound around the toroidal core 902, the four wires are electrically shorted together by twisting together upon exiting the toroidal core 902. Thus, according to exemplary embodiments of the present disclosure, the disclosed DC coupling circuitry provides a line 1 to line 2 high impedance-coupling device for AC signal blocking, but allows for DC pass-through for line 1 and line 2 to output line 3.

Further advantages associated with the exemplary common mode choke disclosed herein relates to the choke's self resonant frequency (SRF). As is known to persons skilled in the art, typical chokes exhibit some level of self-capacitance or distributed capacitance. A choke's self-capacitance, in conjunction with the choke's design inductance, is generally resonant at some particular frequency. Thus, according to the present disclosure, by twisting the external input and output lines, the performance of the choke, e.g., as measured by a lowered SRF factor, is improved.

It is noted that the disclosed common mode choke differs in substantial ways from an AC transformer. A transformer transforms electrical energy into magnetic energy, then back into electrical energy again. Because its operation depends on electromagnetic induction between two stationary coils and a magnetic flux of changing magnitude and polarity, transformers are necessarily AC devices. Its schematic symbol looks like two inductors (coils) sharing the same magnetic core whose primary and secondary coils are electrically isolated. The disclosed common mode chokes operate in fundamentally different ways. It is further noted that the toroidal shape of the core according to exemplary embodiments of the present disclosure further differentiates the disclosed common mode chokes, e.g., as compared to other types of AC blocking devices, e.g., with solenoidal (rod-shaped) cores. The toroidal core of the present disclosure provides more inductance over a broader range of frequencies for a given core material and number of turns. Moreover, the disclosed DC coupling circuitry may be advantageously employed for RJ45 input to RJ45 output connecting hardware.

The common mode choke design schematically depicted in FIGS. 16 and 17 is incorporated into the electrical electrical configuration of FIG. 11 and offers advantageous performance results. In other words, common mode chokes 608, 610, 612, 614 of FIG. 11 are structurally and functionally equivalent to the common mode choke designs of FIGS. 16 and 17. More particularly, both input wires of the common mode choke design of FIGS. 16 and 17 are wrapped around the core without physical wire separation. The input wires wrap in opposite directions for flux cancellation, and they are also wrapped on opposite sides of the core, thereby advantageously increasing/improving the differential and common mode impedances achieved.

By utilizing a two-stage compensation method (e.g., as disclosed in the Aekins '681 patent) with appropriate DC coupling circuitry (e.g., the advantageously disclosed common mode chokes herein), substantial crosstalk noise reduction is achieved and the data signal is maintained. The end result is an inter-matable device that provides lower NEXT noises at higher frequencies than conventional inter-matable connecting hardware devices that provide only a single stage compensation. In addition, the disclosed devices and systems facilitate the supply of power for DC-ready devices on high speed networks. Moreover, as disclosed herein, the exemplary DC coupling systems of the present disclosure can be used to advantage in a RJ45 input to RJ45 output structured component design.

FIGS. 18A, 18B, 19A and 19B provide PCB traces according to an alternative exemplary embodiment of the present disclosure.

Figure 20A:
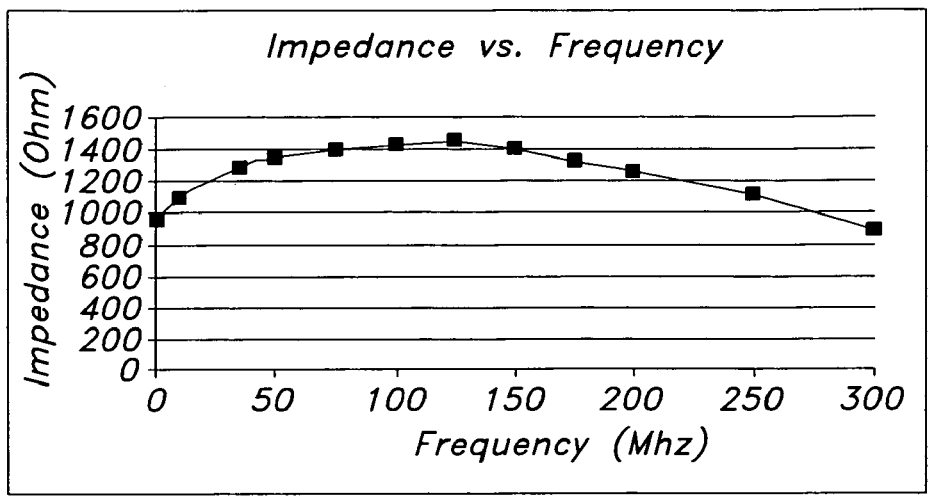
FIGS. 20A–20C are electrical performance graphs of systems according to the present disclosure.
Figure 20B:
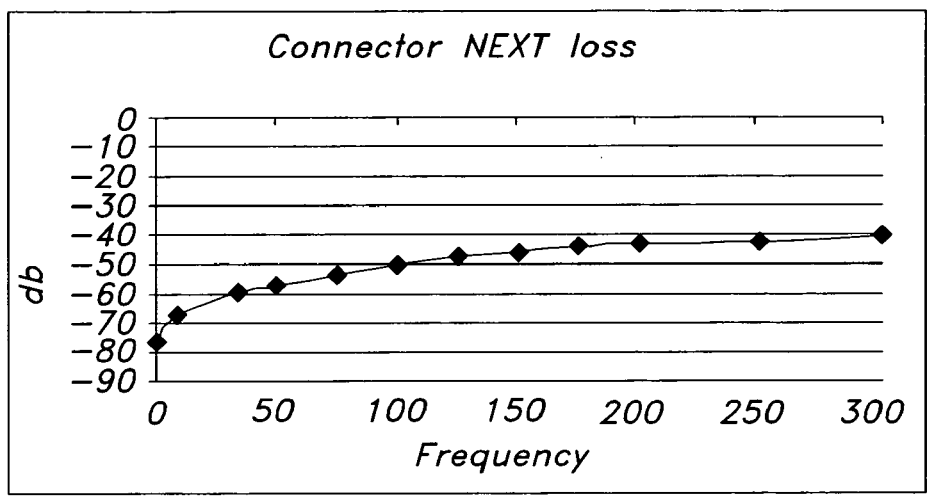
Figure 20C:
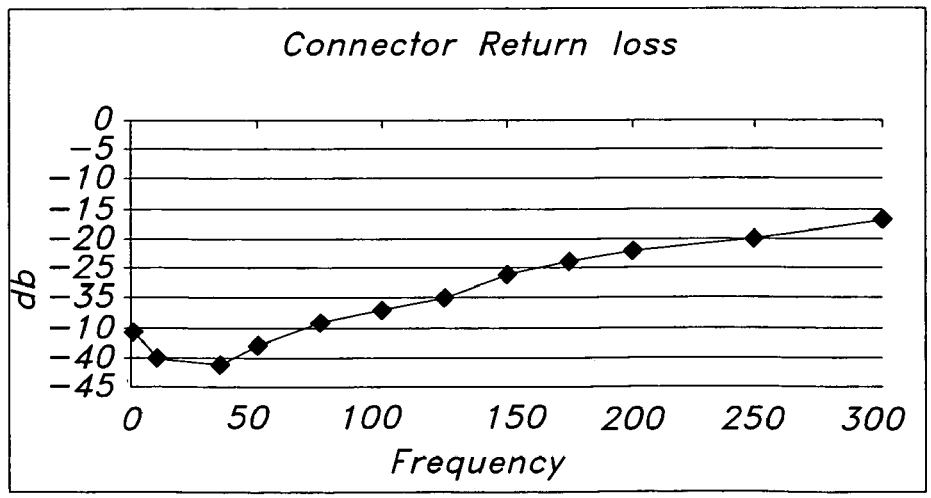

FIGS. 20A–20C set forth graphs reflecting the electrical performance of exemplary connecting hardware according to the present disclosure. FIG. 20A shows impedance performance relative to the frequency of the DC coupling circuitry. FIG. 20B shows NEXT loss performance relative to frequency for connecting hardware that is electrically connected with the disclosed DC coupling circuitry. It is noted that the NEXT loss performance reflected in FIG. 20B meets the requirements of EIA 568B.2 and B.2-1 C5e and C6 for connecting hardware. FIG. 20C shows Return Loss relative to frequency for connecting hardware that is electrically connected with the disclosed DC coupling circuitry. As with the NEXT loss performance reflected in FIG. 20b, the Return Loss performance set forth in FIG. 20C meets the requirements of EIA 568B.2 and B.2-1 C5e and C6 for connecting hardware.

It should be understood that accessory elements may be advantageously mounted with respect to the exemplary patch panels of the present disclosure, e.g., to facilitate cable management functions associated therewith, without departing from the spirit or scope of the present disclosure. Thus, for example, one or more wire management brackets may be mounted to the rear of the connector assemblies 102, 104. In such embodiments, wires/cables may be mounted to the rear of the connector assemblies 102, 104 and routed rearwardly toward the wire management brackets. In addition, one or more cable manager(s) may be mounted to the front face of the patch panel assembly. Examples of wire management brackets and cable managers are described in commonly owned U.S. patent application Ser. No. 10/724,792, entitled "Cable Management System", filed on Dec. 1, 2003, the disclosure of which is expressly incorporated by reference herein in its entirety.

The patch panel assembly may be used with or without the power supply assembly and/or the controller assembly. Thus, the patch panel assembly can be used as a stand alone patch panel or as part of a patch panel and power distribution system. Consequently, the patch panel assembly, the controller assembly and the power supply assembly can be installed into a network at the same time (i.e., as a system), or alternatively, the patch panel assembly could be installed into a network without the controller assembly and/or the power supply assembly. If desired, the controller assembly and/or power supply assembly could be installed thereafter, without any need to remove the patch panel from the rack. If the controller assembly and/or power supply assembly are to be installed after the patch panel assembly is "on line" (i.e., in use in the network) it may be desirable, in at least some instances, to install the controller assembly and/or power supply assembly without taking the patch panel assembly "off line" (i.e., out of use) and/or shutting down the network. Keeping the patch panel assembly "on line" enables devices connected therethrough to continue to operate while the controller and/or power supply assemblies are installed.

The ability to install the controller assembly and the power supply assembly after the patch panel assembly allows a network operator to upgrade the network at any time without any requirement to remove and reinstall the patch panel assembly along with all the connections thereto. Moreover, in the event that the controller assembly and/or power supply assembly develop a malfunction, one or both can be removed without any absolute need to remove the patch panel assembly from the rack. This facilitates repair or replacement of the controller assembly and/or power supply assembly. Furthermore, as in the case where the controller assembly and/or power supply assembly are installed after the patch panel is brought "on line", it may be desirable, in at least some instances, to reinstall and/or replace the controller assembly and/or power supply assembly without taking the patch panel assembly "off line" (i.e., out of use) and/or shutting down the network. As stated above, keeping the patch panel assembly "on line" enables devices connected therethrough to remain connected to the network while the controller and/or power supply assemblies are removed, and consequently, any devices that do not rely on power from the controller and power supply assemblies could continue to operate.

Thus, exemplary embodiments of the disclosed system enables the power supply assembly to be mounted in either of two alternative positions. While mounted, the power supply assembly is releasably locked to the patch panel assembly by virtue of a plurality of abutments and a releasable catch. Mounting in one of the alternative positions helps to minimize obstructions and maximize clearance behind the first connector assembly to thereby facilitate access to the rear portion of the first connector assembly. Mounting in the other of the alternative positions helps to minimize obstructions and maximize clearance behind the second connector assembly to thereby facilitate access to the rear portion of the second connector assembly.

As noted above, the patch panel assembly may be employed with or without the power supply assembly. If a power supply assembly is employed, the power supply may be moved from one position to the other, to help maximize clearance and thereby make it easier to make, inspect, and/or remove connections to contacts and/or other structures disposed at the rear of the connector modules and/or in the vicinity thereof.

It should be understood that the present invention is not limited to the particular embodiments described above. For example, while the patch panel assembly described above provides sixteen ports, other embodiments may employ patch panels that employ more than sixteen ports and/or less than sixteen ports. Indeed, in exemplary embodiments of the present disclosure, patch panels and/or methods for use therewith may employ eight ports, twenty four ports, thirty two ports, forty eight ports, or any other number of ports. Thus, although the patch panel described above has two connector assemblies, the present invention is not limited to such exemplary embodiments. Some other embodiments may have a different number of connector assemblies or no connector assemblies at all. Moreover, connector assemblies are not limited to connector assemblies that include RJ45 jacks and insulation displacement contacts (IDC's).

In addition, although the patch panel described above has a substantially planar front face, it should be understood that some embodiments may be employed in connection with a patch panel having angled panels. A patch panel with angled panels is described in commonly owned U.S. patent application Ser. No. 10/748,604, entitled "Angled Patch Panel", filed on Dec. 30, 2003, the disclosure of which is expressly incorporated by reference herein in its entirety.

Furthermore, although the patch panel and power distribution system described above is mounted in a conventional 19 inch equipment rack in compliance with EIA RS-310, other embodiments may be adapted for mounting in other rack systems which may or may not comply with one or more standard interfaces for mounting components in the rack system. Although the patch panel and power distribution system described above has a height (with the power supply assembly and the connector assembly mounted therein) of about 1.75 inches, i.e., about one rack mount unit ("1U") of an EIA RS-310 rack system, it should be understood however that the present invention is not limited to such exemplary embodiment. For example, in some exemplary embodiments, the system may have a height of about 3.5 inches. In some other embodiments, the system may have a height of about 5.25 inches or some even greater height. In some other embodiments, the height of the system may not be a multiple of about 1.75 inches. In addition, although the patch panel described above is shown having mounting flanges with round openings for fasteners to mount the patch panel to support members of a rack, it should be understood that the present invention is not limited to such exemplary embodiments. For example, in other exemplary embodiments, slots and/or some other mounting feature(s), with or without mounting flanges, may be employed for mounting the patch panel to part(s) of a rack. In yet other embodiments, the patch panel assembly may not be adapted to be mounted to a rack.

It should also be understood that some embodiments of the present invention may employ a different power supply assembly and/or controller assembly. For example, some embodiments may employ a power supply assembly without mechanical features of the exemplary power supply assemblies described above. Some embodiments may employ a power supply and/or controller that supplies different power supply voltages and/or different amounts of power to different network transmission media (and thus to different devices via different ports). For example, in some exemplary embodiments, voltages other than 48 VDC and COMMON may be employed. In some embodiments, some ports may supply 48 VDC and COMMON and other ports may supply different voltages. Some embodiments may employ a power supply with a step up transformer, a step down transformer and/or an isolation transformer. Yet some other embodiments may not include any type of power supply assembly and/or controller assembly at all.

In addition, although, the system disclosed above includes a plurality of light emitting diodes for indicating whether power is being supplied to ports of the system, it should be understood that alternative exemplary embodiments of the present disclosure may employ a different type of indicator (or indicators) for indicating whether power is being supplied to such ports. It should also be understood that some other embodiments may not include any indicator (or indicators) for indicating whether power is being supplied to any of the ports.

In addition, it should also be understood that some embodiments of the present invention may not employ the modules and/or circuit configurations described above. For example, some embodiments may employ other modules and/or circuitry.

The present invention may be employed in association with any type of communication system, for example, a local area network (LAN), a wide area network (WAN), an asynchronous transfer mode (ATM) network, the Internet and/or combinations thereof. In some embodiments, power may be supplied over network transmission media other than Ethernet network transmission media. Furthermore, although the networks described above employ various types of devices, it should be understood that the present disclosure does not require the presence of every such type of device. For example, although the exemplary LAN described herein includes a hub (or a switch) and a power manager, other exemplary embodiments may omit such types of devices and/or may employ other types of devices in their place. It should also be understood that in other exemplary embodiments, the disclosed system provides power to other types of devices, e.g., other types of small appliances and/or computer peripherals.

In the event that a processor is used, for example, in the controller, such processor may be any kind of processor. For example, the processor may be programmable or non programmable, general purpose or special purpose, dedicated or non dedicated, distributed or non distributed, shared or not shared, and/or any combination thereof. A processor may comprise hardware, software, firmware, hardwired circuits and/or any combination thereof. The processor may or may not execute one or more computer programs that have one or more subroutines, or modules, each of which may include a plurality of instructions, and may or may not perform tasks in addition to those described herein. If the computer program includes more than one module, the modules may be parts of one computer program, or may be parts of separate computer programs. It should be recognized, that as used herein, the term module is not limited to a subroutine but rather may for example comprise hardware, software, firmware, hardwired circuits and/or any combination thereof.

In exemplary embodiments of the present disclosure, the processor may include at least one processing unit connected to a memory system via an interconnection mechanism (e.g., a data bus). A memory system may include a computer-readable and writeable recording medium. The medium may or may not be non-volatile. Examples of non-volatile media include a magnetic disk, flash memory, and magnetic tape. A disk may be removable, e.g., known as a floppy disk, or permanent, e.g., known as a hard drive. Examples of volatile memory include but are not limited to random access memory, e.g., dynamic random access memory (DRAM) or static random access memory (SRAM), which may or may not be of a type that uses one or more integrated circuits to store information. A variety of mechanisms are known for managing information movement between a disk and an integrated circuit memory element.

If the processor executes one or more computer programs, such computer programs may be implemented as a computer program product tangibly embodied in a machine-readable storage medium or device for execution by a computer. Further, if the processor is a computer, such computer is not limited to a particular computer platform, particular processor, or programming language. Computer programming languages may include but are not limited to procedural programming languages, object oriented programming languages, and combinations thereof.

A general purpose computer system may or may not execute a program called an operating system, which may or may not control the execution of other computer programs and provides scheduling, debugging, input/output control, accounting, compilation, storage assignment, data management, communication control, and/or related services. A general purpose computer system may for example be programmable using a computer language such as C, C++, Java or other language, such as a scripting language or even assembly language. The computer system may also be specially programmed, special purpose hardware, or an application specific integrated circuit (ASIC).

A communication link may be any kind of communication link including but not limited to, for example, wired (e.g., conductors, fiber optic cables) or wireless (e.g., microwave links, satellite links, infrared links), and combinations thereof, each of which may be public or private, dedicated and/or shared (e.g., a network). The communication link may employ for example circuit switching or packet switching or combinations thereof. Other examples of communication links include dedicated point-to-point systems, wired networks, and cellular telephone systems. The communication link may employ any protocol or combination of protocols including but not limited to the Internet Protocol.

Example input devices include but are not limited to manual switches and/or push buttons, keyboards, keypads, track ball, mouse, pen and tablet, light pen, touch screens, and data input devices such as audio and video capture devices. Examples of output devices include but are not limited to, cathode ray tube (CRT) devices, liquid crystal displays (LCD), plasma displays and other video output devices, printers, communication devices for example modems, storage devices such as a disk or tape and audio output, and devices that produce output on light transmitting films or similar substrates.

Note that, except where otherwise stated, phrases such as, for example, "extends laterally" mean "extends in a direction that has, but is not limited to, a lateral component." Thus, for example, "extends laterally" means "extends in a direction that is purely lateral" or "in a direction that has a lateral component in addition to an axial and/or circumferential component", which includes but is not limited to, "substantially laterally".

Also note that, except where otherwise stated, the term "retain" means "releasably retain" or "permanently retain" in any way.

Also, except where otherwise stated, the term "restrain" means "releasably restrain" or "permanently restrain" in any way.

Also note that, except where otherwise stated, phrases such as, for example, "connected to" mean "connected directly to" or "connected indirectly to".

Also note that, except where otherwise stated, terms such as, for example, "comprises", "has", "includes", and all forms thereof, are considered open-ended, so as not to preclude additional elements and/or features.

Thus, while there have been shown and described various embodiments, it will be understood by those skilled in the art that the various aspects of the present invention are not limited to such embodiments, which have been presented by way of example only, and that various changes and modifications may be made without departing from the spirit and scope of the invention. Accordingly, the various aspects of the present invention are limited only by the appended claims and equivalents thereto.

The invention claimed is:

1. Apparatus for use in coupling power from a power supply to a device over a network transmission medium, the power supply having a first terminal and a second terminal, the network transmission line including first and second electrical conductors, the apparatus comprising:
  a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;
  a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;
  at least one core for coupling the first and second windings of the first device and for coupling the first and second windings of the second device;
  wherein the at least one core comprises a first core for coupling the first and second windings of the first device and for coupling the first and second windings of the second device.

2. The apparatus of claim 1, wherein the first and second windings of the first device each have at least one winding wound around a core of said at least one core and the first and second windings of the second device each have at least one winding wound around a core of said at least one core.

3. The apparatus of claim 1, wherein the first and second windings of the first device are each wound around a core of said at least one core and the first and second windings of the second device are each wound around a core of said at least one core.

4. Apparatus for use in coupling power from a power supply to a device over a network transmission medium, the power supply having a first terminal and a second terminal, the network transmission line including first and second electrical conductors; the apparatus comprising:
  a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;
  a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;
  at least one core for coupling the first and second windings of the first device and for coupling the first and second windings of the second device;
  wherein the at least one core comprises a first core, the first and second windings of the first device each have at least one winding wound around said first core and the first and second windings of the second device each have at least one winding wound around said first core.

5. Apparatus for use in coupling power from a power supply to a device over a network transmission medium, the power supply having a first terminal and a second terminal, the network transmission line including first and second electrical conductors, the apparatus comprising:
  a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;

a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;

at least one core for coupling the first and second windings of the first device and for coupling the first and second windings of the second device;

wherein the at least one core comprises a first core, the first and second windings of the first device are each wound around said first core and the first and second windings of the second device are each wound around said first core.

6. The apparatus of claim 5, wherein the core comprises a toroidal shape core.

7. The apparatus of claim 1, wherein the first and second windings of the first device are wound bifilar with one another.

8. The apparatus of claim 1, wherein the first and second windings of the second device are wound bifilar with one another.

9. The apparatus of claim 1, wherein the first and second windings of the first device are wound bifilar with one another and the first and second windings of the second device are wound bifilar with one another.

10. Apparatus for use in coupling power from a power supply to a device over a network transmission medium, the power supply having a first terminal and a second terminal, the network transmission line including first and second electrical conductors, the apparatus comprising:

a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;

a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;

at least one core for coupling the first and second windings of the first device and for coupling the first and second windings of the second device; and circuitry for coupling a first data signal to the network transmission medium;

wherein the first data signal is a differential signal comprising a first signal and a second signal, the circuitry includes a first capacitor and a second capacitor, the first capacitor couples the first signal to the network transmission medium and the second capacitor couples the second signal to the network transmission medium.

11. The apparatus of claim 10, wherein the first capacitor couples the first signal to the first electrical conductor of the network transmission medium and the second capacitor couples the second signal to the second electrical conductor of the network transmission medium.

12. Apparatus for use in coupling power from a power supply to a device over a network transmission medium, the power supply having a first terminal and a second terminal, the network transmission line including first and second electrical conductors; the apparatus comprising:

a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;

a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;

at least one core for coupling the first and second windings of the first device and for coupling the first and second windings of the second device; and a third device and a fourth device, the third device having a first winding and a second winding, the first winding of the third device being electrically connected between the second terminal of the power supply and a third electrical conductor of the network transmission medium, the second winding of the third device being coupled between the second terminal of the power supply and the third electrical conductor of the network transmission medium, the fourth device having a first winding and a second winding, the first winding of the fourth device being electrically connected between the second terminal of the power supply and a fourth electrical conductor of the network transmission medium, the second winding of the fourth device being coupled between the second terminal of the power supply and the fourth electrical conductor of the network transmission medium.

13. Apparatus for use in coupling power from a power supply to a device over a network transmission medium, the power supply having a first terminal and a second terminal, the network transmission line including first and second electrical conductors, the apparatus comprising:

a first device having a first winding and a second winding, the first winding being electrically connected between the first terminal of the power supply and the first electrical conductor of the network transmission medium, the second winding being coupled between the first terminal of the power supply and the first electrical conductor of the network transmission medium;

a second device having a first winding and a second winding, the first winding of the second device being electrically connected between the first terminal of the power supply and the second electrical conductor of the network transmission medium, the second winding of the second device being coupled between the first terminal of the power supply and the second electrical conductor of the network transmission medium;

at least one core for coupling the first and second windings of the first device and for coupling the first and second windings of the second device; and circuitry for coupling a second data signal to the network transmission line;

wherein a second data signal is a differential signal comprising a first signal and a second signal, the circuitry further includes a third capacitor and a fourth capacitor, the third capacitor couples the first signal of the second data signal to the network transmission medium and the fourth capacitor couples the second signal of the second data signal to the network transmission medium.

14. The apparatus of claim 13, further comprising a third device and a fourth device, the third device having a first winding and a second winding, the first winding of the third device being electrically connected between the second terminal of the power supply and a third electrical conductor of the network transmission medium, the second winding of the third device being coupled between the second terminal of the power supply and the third electrical conductor of the network transmission medium, the fourth device having a first winding and a second winding, the first winding of the fourth device being electrically connected between the second terminal of the power supply and a fourth electrical conductor of the network transmission medium, the second winding of the fourth device being coupled between the second terminal of the power supply and the fourth electrical conductor of the network transmission medium; and wherein the third capacitor couples the first signal of the second data signal to the third electrical conductor of the network transmission medium and the fourth capacitor couples the second signal of the second data signal to the fourth electrical conductor of the network transmission medium.

15. Apparatus for use in coupling power from a power supply to a device over a network transmission medium, the power supply having a first terminal and a second terminal, the network transmission line including first and second electrical conductors, the apparatus comprising:

a first common mode choke having a first winding and a second winding, the first winding of the first common mode choke being electrically connected between the first terminal of the power supply and the first electrical conductor of the network transmission medium, the second winding of the first common mode choke being coupled between the first terminal of the power supply and the first electrical conductor of the network transmission medium;

a second common mode choke having a first winding and a second winding, the first winding of the second common mode choke being electrically connected between the first terminal of the power supply and the second electrical conductor of the network transmission medium, the second winding of the second common mode choke being coupled between the first terminal of the power supply and the second electrical conductor of the network transmission; and a third common mode choke and a fourth common mode choke, the third common mode choke having a first winding and a second winding, the first winding of the third common mode choke being electrically connected between the second terminal of the power supply and a third electrical conductor of the network transmission medium, the second winding of the third common mode choke being coupled between the second terminal of the power supply and the third electrical conductor of the network transmission medium, the fourth common mode choke having a first winding and a second winding, the first winding of the fourth common mode choke being electrically connected between the second terminal of the power supply and a fourth electrical conductor of the network transmission medium, the second winding of the fourth common mode choke being coupled between the second terminal of the power supply and the fourth electrical conductor of the network transmission medium.

16. The apparatus of claim 15, wherein the first common mode choke further comprises a core, the first and second windings of the first common mode choke each having at least one winding wound around said core.

17. The apparatus of claim 15, wherein the first common mode choke further comprises a core, the first and second windings of the first common mode choke each being wound around said core.

18. The apparatus of claim 15, wherein the core comprises a toroidal shape core.

19. The apparatus of claim 15, wherein the second common mode choke further comprises a core, the first and second windings of the second common mode choke each having at least one winding wound around said core.

20. The apparatus of claim 15, wherein the second common mode choke further comprises a core, the first and second windings of the second common mode choke each being wound around said core.

21. The apparatus of claim 20, wherein the core comprises a toroidal shape core.

22. The apparatus of claim 15, wherein the first common mode choke and the second common mode choke share a core, the first and second windings of the first common mode choke each having at least one winding wound around said core, the first and second windings of the second common mode choke each having at least one winding wound around said core.

23. The apparatus of claim 15, wherein the first common mode choke and the second common mode choke share a core, the first and second windings of the first common mode choke each being wound around said core, the first and second windings of the second common mode choke each being wound around said core.

24. The apparatus of claim 23, wherein the core comprises a toroidal shape core.

* * * * *